(12) United States Patent
Fujita

(10) Patent No.: US 7,281,860 B2
(45) Date of Patent: Oct. 16, 2007

(54) OPTICAL TRANSMITTER

(75) Inventor: Hideaki Fujita, Shiki-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/559,425

(22) PCT Filed: May 28, 2004

(86) PCT No.: PCT/JP2004/007394

§ 371 (c)(1),
(2), (4) Date: Dec. 6, 2005

(87) PCT Pub. No.: WO2004/109814

PCT Pub. Date: Dec. 16, 2004

(65) Prior Publication Data

US 2006/0124946 A1    Jun. 15, 2006

(30) Foreign Application Priority Data

Jun. 6, 2003  (JP) ............................. 2003-162824

(51) Int. Cl.
*G02B 6/36* (2006.01)
*H01L 33/00* (2006.01)
(52) U.S. Cl. ........................................ 385/88; 257/98
(58) Field of Classification Search .................... None
See application file for complete search history.

(56) References Cited

U.S. PATENT DOCUMENTS 6,898,340 B2 * 5/2005 Tanaka ......................... 385/14

FOREIGN PATENT DOCUMENTS

| JP | SHO-55-154564 | 1/1980 |
|----|---------------|--------|
| JP | 58-056483 | 4/1983 |
| JP | 59-180515 | 10/1984 |
| JP | 60-012782 | 1/1985 |
| JP | 62-017721 | 1/1987 |
| JP | 01-241185 | 9/1989 |
| JP | 03-188312 | 8/1991 |
| JP | 07-007184 | 1/1995 |
| JP | 2002-040299 | 2/2002 |
| JP | 2002-246653 | 8/2002 |
| JP | 2002-270859 | 9/2002 |

* cited by examiner

*Primary Examiner*—Tina Wong
(74) *Attorney, Agent, or Firm*—David G. Conlin; David A. Tucker; Edwards Angell Palmer & Dodge LLP

(57) ABSTRACT

The present invention provides an optical transmitter for transmitting an optical signal using an optical fiber as a transmission medium. The optical transmitter comprises: a substrate having a through hole; and a light-emitting element disposed on a rear surface of the substrate and having a light-emitting portion. The through hole has an inner wall. The through hole has an inside diameter increasing from a rear surface side of the substrate toward a front surface side thereof. The light-emitting element is disposed so that the light-emitting portion is exposed within the through hole. The light-emitting portion radiates light beams toward a front surface of the substrate. The through hole is such that part of the light beams goes out the through hole without being reflected, and that the other light beams go out the through hole after being reflected from the inner wall thereof. It is possible to increase the coupling efficiency of the optical transmitter by effectively utilizing a light beam light having a wide radiation angle, and improve heat dissipation thereof, while achieving miniaturization and cost reduction of the optical transmitter.

25 Claims, 14 Drawing Sheets

OPTICAL TRANSMITTER

TECHNICAL FIELD

The present invention relates to an optical transmitter. More particularly, the present invention relates to an optical transmitter for transmitting an optical signal using an optical fiber as a transmission medium.

BACKGROUND ART

There have been known optical transmitters using a light-emitting diode as a light source and a multimode optical-fiber as a transmission medium in domestic communications, in communications inside of motor vehicles and the like using LAN (Local Area Network). As prior arts associated with the present invention, the following are known.

(1) A photosemiconductor device characterized by comprising: a pair of conductive leads arranged facing each other; a metal container having a reflecting surface and disposed at a distal end of one of the conductive leads; a photosemiconductor element disposed on the reflecting surface of the metal container, one electrode of the photosemiconductor element being connected to one of the conductive leads; and a wire for connecting the other electrode of the photosemiconductor element to the other conductive lead (see, e.g., Japanese Unexamined Patent Publication No. Sho 58(1983)-56483).

(2) A light-emitting element for optical fiber coupling, which, via a transparent member, leads a light beam emitted from a light-emitting element pellet disposed on a light-emitting element supporter, the light-emitting element characterized by comprising the transparent member having a flat disc-shaped central portion and a peripheral portion, the flat disc-shaped central portion facing the light-emitting element pellet, the peripheral portion having a thickness decreasing as the distance from the center of the transparent member increases (see, e.g., Japanese Unexamined Patent Publication No. Sho 59(1984)-180515).

(3) A semiconductor light-emitting device characterized by comprising: a case; a light-emitting element accommodated in the case; lead members for supplying electric power to the light-emitting element from the outside; a connecting portion defined on the case for connecting an optical fiber to the case, the optical fiber guiding a light beam emitted from the light-emitting element so that the light beam is radiated via the optical fiber connected to the connecting portion; and a concave reflecting surface facing a light-emitting surface of the light-emitting element for reflecting the light beam emitted from the light-emitting element and thereby directing the light beam to a light-receiving surface of the optical fiber (see, e.g., Japanese Unexamined Patent Publication No. Hei 1(1989)-241185).

(4) A range finder measuring distances to a plurality of points, characterized by comprising a plurality of light-emitting sources and at least one photoreceptor, the light-emitting source being semiconductor chips respectively mounted on the bottoms of a plurality of recesses formed in a lead frame (see, e.g., Japanese Unexamined Patent Publication No. Hei 3(1991)-188312).

(5) A projector characterized by comprising (i) a half or less than a half of a paraboloid of revolution obtained by dividing a paraboloid of revolution by a face containing the axis of revolution, the half or less than half having a specular surface in the form of a paraboloid, and (ii) a light source arranged near a focal point on the paraboloid so that a center luminous flux of light emitted from the light source is incident on the specular surface (see, e.g., Japanese Unexamined Patent Publication No. Sho 62(1987)-17721).

(6) An optical coupling device for guiding, to a light-receiving surface at a proximal end of an optical fiber, a light beam emitted from a light-emitting element, the optical fiber being arranged facing the light-emitting element, the optical coupling device characterized by comprising: a transmissive-type light-collecting means arranged between the light-emitting element and the optical fiber for allowing a light beam emitted from the light-emitting element to pass through the transmissive-type light-collecting means so that the light beam is collected onto the optical fiber; and a reflective-type light-collecting means arranged around the transmissive-type light-collecting means, the reflective-type light-collecting means having a reflecting surface for reflecting a light beam radiated from the light-emitting element so that the light beam is collected onto the optical fiber, the reflecting surface of the reflective-type light-collecting means being a rotary elliptical surface, the rotary elliptical surface forming two focal points, the light-emitting element being arrange on one of the focal point, the light-receiving surface of the optical fiber being arranged on the other focal point (see, e.g., Japanese Unexamined Patent Publication No. 2002-40299).

(7) A structure for mounting a light-emitting diode comprising: a first lead frame having a chip-mounting seat with a photo penetration hole formed though the chip-mounting seat; an LED chip mounted on the first lead frame so that a light-emitting surface of the LED chip faces the photo penetration hole of the first lead frame; and a second lead frame bonded to a rear electrode of the LED chip by a wire, the structure characterized in that the LED chip, the wire, and distal ends of the respective first lead frame and second lead frame are covered with a transparent resin (see, e.g., Japanese Unexamined Patent Publication No. Sho 60(1985)-12782).

As a common optical transmitter for coupling an LED (light-emitting diode) and an optical fiber, there is known, for example, an optical transmitter, shown in FIG. 21, which is produced by transfer mold.

The optical transmitter 101 shown in FIG. 21 comprises a lead frame 105, an LED 103 arranged on the lead frame 105, a mold resin 109 that covers the lead frame 105 and the LED 103, a lens 104 formed of the same resin that forms the mold resin 109, and an optical fiber 102. Light beams radiated from the LED 103 are collected by means of the lens 104 onto the optical fiber 102.

However, there is a problem with this optical transmitter that it is difficult to couple light beams radiated form the LED 103 into the optical fiber 102 with high efficiency.

This problem is associated with a far field pattern (FFP) of an LED shown in FIG. 22. That is, the far field pattern of the LED is the Lambert Pattern where generally, the radiation intensity of the LED is represented by the cosine function. The far field pattern of the LED has a feature that a light beam from the LED has a wide radiation angle when compared with one from a semiconductor laser or the like. For this reason, in the optical system shown in FIG. 21, which is produced by transfer mold, a light beam having a wide radiation angle, of light beams emitted from the LED 103, cannot be coupled to the lens 104, giving rise to a loss.

One approach to this problem is to bring the lens 104 closer to the LED 103 for coupling a light beam having a wide radiation angle to the lens 104. However, bringing the lens 104 closer to the LED 103 causes the failure to ensure in a direction of the thickness of the optical transmitter a space required for wire-bonding of an electrode of the LED 103 to the lead frame. Further, the above approach requires that the lens 104 has a reduced focal length (i.e., that the lens 104 has a flattened curvature). With all these things considered, it is difficult to take the approach of bringing the lens 104 closer to the LED 104 to increase the efficiency of coupling in the optical fiber 102.

On the other hand, there have been proposed various methods of changing the optical path of a light beam having a wide radiation angle by reflecting the light beam from a concave mirror to increase the utility efficiency of light beams.

As a common optical transmitter utilizing a concave mirror, there is known, for example, one shown in FIG. 23.

In an optical transmitter 201, shown in FIG. 23, a substrate 205 has a concave portion in a part thereof. The concave portion serves as a concave mirror 108 having high reflectance and having an inside diameter gradually increasing from a bottom surface side thereof toward an upper edge side thereof. A LED 103 is disposed so that a rear surface side of the LED 103 (opposite a light-emitting surface 106) is in contact with the bottom surface side of the concave portion.

Of light beams radiated from the light-emitting surface 106 of the LED 103, a light beam having a wide radiation angle is reflected from the concave mirror 108 so that its optical path is changed toward a distal end of an optical fiber, not illustrated. Thus, even a light beam having a wide radiation angle can also be effectively used.

However, in an optical transmitter using a concave mirror, it is difficult to increase the coupling efficiency while achieving miniaturization and cost reduction of the optical transmitter.

That is, for example, in the optical transmitter 201 shown in FIG. 23, assuming that: the LED 103 is in the shape of a cube with a height of 300 μm and a width of 300 μm; the concave mirror 108 has a cone angle θ of 60°; and the concave portion has an inside diameter of φ 500 μm on the bottom surface side thereof, the concave portion needs to have a depth T0 of about 1.3 mm and an inside diameter R0 of 2 mm on the upper edge side in order for the concave mirror 108 to change the optical path of a light beam having a radiation angle of 45° or wider, of light beams radiated from the center of the light-emitting surface 106 of the LED 103. As a result, a lens with a diameter of φ 2 mm or greater is needed to collect and then couple into the optical fiber the light beams the optical paths of which have been changed by the concave mirror 108.

If the inside diameter of the concave mirror 108 on a side at which radiated light beams are raised, i.e., on the upper edge side, is as large as about φ 2 mm, there is a risk that, when a lens with a short focal length is used to collect light beams, the light beams may not be able to be coupled into the optical fiber because an NA incident to the optical fiber becomes so large that the light beams cannot be coupled into the optical fiber. On the other hand, when using a lens with a long focal length in order to take an advantage of a small incident NA, it is difficult to miniaturize the optical transmitter inclusive of the optical fiber.

Here, if the concave mirror 108 is curved, the optical transmitter can be slightly miniaturized, but is still larger than the one shown in FIG. 21. Further, a space needs to be provided at a portion of the concave mirror 108 for wire-bonding the electrode of the LED 103, which complicates the production process and widens a variation in transmission efficiency and thus a variation in the quantity of light coupled into the optical fiber. That is, depending on precisions in the location and shape of the concave mirror 108, the direction of light varies to result in variation in transmission efficiency, which widens a variation in the quantity of light coupled into the optical fiber. This creates the need to increase the dynamic range in optical transmission. Also, the substrate 205 needs to have therein the concave mirror 108, which results in a high cost. As has been explained above, in an optical transmitter using a concave mirror, after all, it is difficult to increase the coupling efficiency while achieving miniaturization and cost reduction of the optical transmitter.

Other than optical transmitters having the concave mirror, there are known one having a parabola-shaped mirror for improvement in coupling efficiency, one in which a mirror is provided on a side of a lens, and the like. These optical transmitters are problematic in that the number of components is increased to result in upsizing and a rise in the cost of the optical transmitters.

On the other hand, there is known an optical transmitter having (i) a lead frame with an opening formed therein and (ii) an LED having a light-emitting surface joined to the lead frame so that a light beam radiated from the light-emitting surface passes through the opening to be coupled into an optical fiber. In such an optical transmitter having the LED arranged on a rear surface of the lead frame, wire-bonding is made on the rear surface side opposite to the front surface side of the lead frame, i.e., to the side at a lens is provided. As a result, the lens (or the optical fiber) can be arranged close to the LED without considering a space required for the above-mentioned wire-bonding so that a relatively high coupling efficiency can be obtained.

However, only forming the opening through the lead frame for a light beam to pass through the opening does not make it possible to guide a light beam with a wide radiation angle to the lens at an effective angle. Therefore, it is eventually difficult to utilize a light beam with a wide radiation angle.

Meanwhile, in an optical transmitter, dissipation of heat generated in a light-emitting element is also important. If the optical transmitter is poor in heat dissipation, the temperature of a light-emitting element chip itself rises. Therefore, the magnitude of an electric current allowed to pass through the light-emitting element is limited, and the environment in which optical transmitters can be used is limited to make it impossible to use them in environments where the temperature is high such as motor vehicles and production facilities. For this reason, there is a need to reduce a thermal resistance of the LED chip and members around the LED chip. As a method of reducing the thermal resistance, there is known a method by disposing the LED chip on a substrate of a material good in heat dissipation. However, with this method there is a problem in that the thermal resistance of the LED chip itself cannot be reduced and that a high cost and upsized optical transmitters are resulted.

On the other hand, in the conventional optical transmitter 101 shown in FIG. 21, in which a surface of the LED 103 is covered with the mold resin 109, there is a problem in that a great thermal stress is created on the LED 103 when the ambient temperature varies, due to a large difference in a linear expansivity generally present between the LED 103 and the mold resin 109. For example, GaAs generally used in a red LED has a linear expansivity of about 6 ppm/K, while the material of the transparent mold resin such as an epoxy resin or the like has a linear expansivity of 60 ppm/K to 65 ppm/K, values substantially an order of magnitude greater. For this reason, there is a problem in that, in environments where wide temperature variations (e.g., from −40° C. to 110° C.) are encountered as expected in vehicle-installed devices and the like, a great thermal stress is applied onto the light-emitting surface of the LED 103 to make the light emission state unstable or make the LED 103 broken, or a bonding wire is ruptured due to a difference in linear expansivity between the bonding wire and the epoxy resin. Thus, it is difficult to gain a high reliability.

DISCLOSURE OF INVENTION

The present invention has been made under these circumstances, and it is an object of the present invention to provide an optical transmitter good in heat dissipation which has high coupling efficiency. The optical transmitter can also be miniaturized and manufactured at a low cost, and can be used and stored over a wide temperature range.

The present invention provides a first optical transmitter comprising: a substrate having a through hole; and a light-emitting element disposed on a rear surface of the substrate and having a light-emitting portion, the through hole having an inner wall, the through hole having an inside diameter increasing from a rear surface side of the substrate toward a front surface side thereof, the light-emitting element disposed so that the light-emitting portion is exposed within the through hole, the light-emitting portion radiating light beams toward a front surface of the substrate, the through hole being such that part of the light beams goes out the through hole without being reflected, and that the other light beams go out the through hole after being reflected from the inner wall thereof.

In the first optical transmitter according to the present invention, the substrate has the through hole. The through hole has the inner wall. The through hole has the inside diameter increasing from the rear surface side of the substrate toward the front surface side thereof. Thus, of light beams radiated from the light-emitting portion, a light beam having a wide radiation angle can be reflected from the inner wall of the through hole toward the front surface of the substrate. Accordingly, the light beam having a wide radiation angle, of the light beams radiated from the light-emitting element, can be also effectively utilized for optical coupling into an optical fiber or the like, increasing the coupling efficiency.

The light-emitting element is disposed on the rear surface of the substrate so that the light-emitting portion is exposed within the through hole. Thus, the light-emitting portion of the light-emitting element is close to the inner wall of the through hole. Accordingly, it is possible to reduce to a minimum the depth of the through hole involved in reflection of a light beam having a wide radiation angle toward the front surface of the substrate. Consequently, miniaturization of the optical transmitter can be achieved.

The through hole formed in the substrate serves as a guide for light beams radiated from the light-emitting element. Thus, the substrate originally for use as a wiring component can also be utilized as an optical component. Accordingly, the number of components can be reduced and the production process can be simplified. Consequently, cost reduction of the optical transmitter can be achieved.

The light-emitting element is disposed so that the light-emitting portion is exposed within the through hole. Thus, the light-emitting portion as a heat-generating source is close to the substrate as a heat-dissipating medium. Accordingly, heat dissipation of the light-emitting element is improved.

BEST MODE FOR CARRYING OUT THE INVENTION

Figure 1:
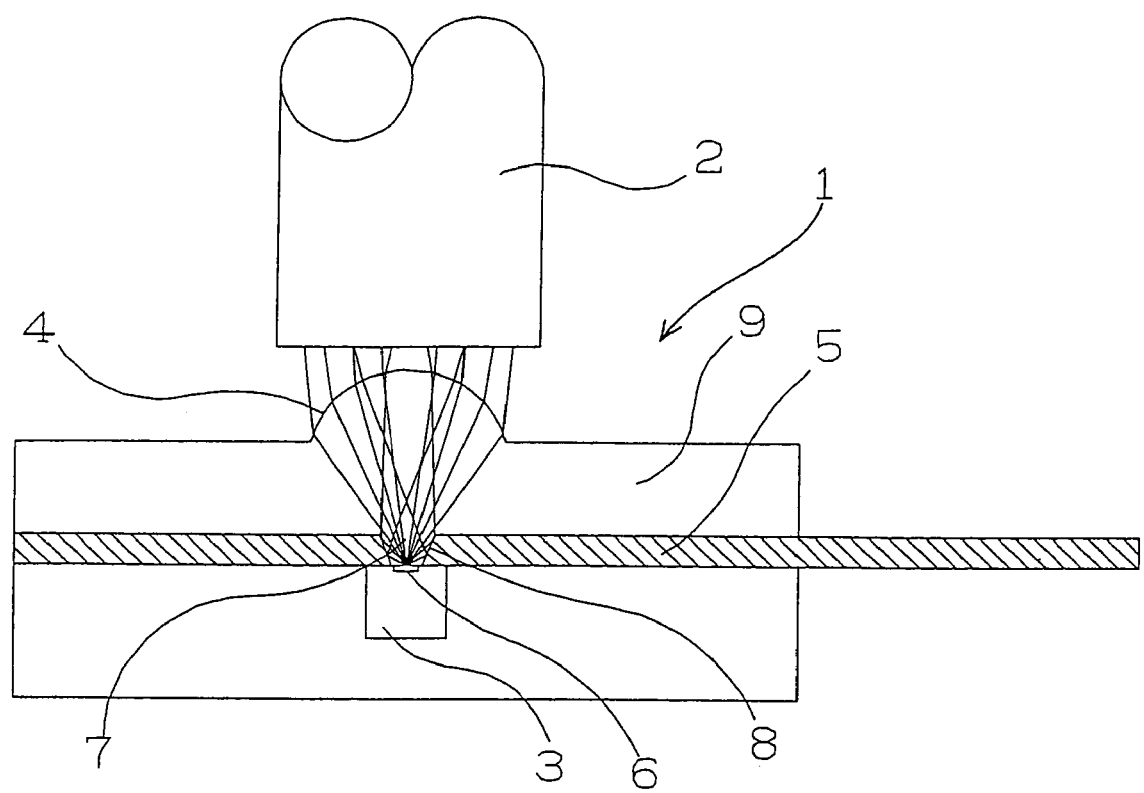
FIG. 1 is an explanatory view showing a schematic construction of an optical transmitter according to Embodiment 1 of the present invention.

A first optical transmitter according to the present invention is characterized by comprising: a substrate having a through hole; and a light-emitting element disposed on a rear surface of the substrate and having a light-emitting portion, the through hole having an inner wall, the through hole having an inside diameter increasing from a rear surface side of the substrate toward a front surface side thereof, the light-emitting element disposed so that the light-emitting portion is exposed within the through hole, the light-emitting portion radiating light beams toward a front surface of the substrate, the through hole being such that part of the light beams goes out the through hole without being reflected, and that the other light beams go out the through hole after being reflected from the inner wall thereof.

In the present invention, the term "radiated light beam" refers to a light beam radiated from the light-emitting portion at a certain radiation angle.

In the first optical transmitter according to the present invention, the substrate may be a lead frame for providing a connection to an outside electric circuit. Examples of lead frames include one mentioned later in Embodiment 1.

In the first optical transmitter according to the present invention, the light-emitting element may include an electrode provided around the light-emitting portion, the electrode electrically connected to the rear surface of the substrate.

With this constitution, in which the electrode is provided around the light-emitting portion, the electrode is in surface-to-surface contact with the rear surface of the substrate, which is a heat-dissipating medium. Heat generated at the light-emitting portion, therefore, can be quickly transmitted to the substrate. Thus, heat dissipation of the light-emitting element is further improved.

In the first optical transmitter according to the present invention, the through hole may comprise a first inner-wall portion provided on the rear surface side of the substrate and a second inner-wall portion provided on the front surface side of the substrate, the first inner-wall portion having an inside diameter gradually increasing toward the front surface side of the substrate, the second inner-wall portion having an inside diameter greater than a maximum inside-diameter of the first inner-wall portion. With this constitution, the through hole can be formed by forming the second inner-wall portion, having a greater inside diameter, and then forming the first inner-wall portion. Thus, the processability of the through hole is improved. Also, the use of a thick substrate leads to an improvement in heat dissipation of the light-emitting element.

In the first optical transmitter according to the present invention, the inner wall of the through hole may be concavely curved. With this constitution, the optical path of a light beam radiated from the light-emitting element can be easily changed so that the light beam rises from the substrate substantially perpendicularly irrespective of the radiation angle of the light beam. Thus, the coupling efficiency can be further increased.

In the first optical transmitter according to the present invention, the substrate may have a thickness of 50 to 500 μm. With this constitution, miniaturization of the optical transmitter can be achieved. Such a thin substrate can be used because the inner wall of the through hole is arranged close to the light-emitting portion of the light-emitting element, so that the depth of the through hole involved in reflection of a light beam having a wide radiation angle toward the front surface of the substrate can be reduced to a minimum.

The first optical transmitter according to the present invention may further comprise an auxiliary substrate arranged so that the light-emitting element is sandwiched between the auxiliary substrate and the substrate, the light-emitting element having a rear electrode on a rear surface thereof opposite the light-emitting portion, the rear electrode electrically connected to the auxiliary substrate. With this constitution, the rear electrode of the light-emitting element is in surface-to-surface contact with the auxiliary substrate. Heat generated at the light-emitting portion, therefore, is dissipated not only from the light-emitting portion but also from the rear surface. Thus, heat dissipation of the light-emitting element is further improved. Here, examples of auxiliary substrates include one mentioned later in Embodiment 3.

The first optical transmitter according to the present invention may further comprise an encapsulating resin-member provided on the rear surface side of the substrate for encapsulating the light-emitting element. With this constitution, the light-emitting element can be shielded from the outside air, so that its degradation with time can be retarded.

In the above constitution in which the encapsulating resin-member is provided, the encapsulating resin-member may be made of a resin, the resin containing a filler for lowering a linear expansivity of the encapsulating resin-member and for raising a thermal conductivity thereof. With this constitution, in which the filler is contained in the resin, which forms the encapsulating resin-member, the linear expansivity and the thermal conductivity of the resin can be easily changed so as to reduce thermal stress created on the light-emitting element and to improve heat dissipation of the light-emitting element. Also, the encapsulating resin-member is provided in an area other than the optical path of the optical element, so that thermal stress and heat dissipation can be improved without damaging the optical properties.

The first optical transmitter according to the present invention may further comprise a transparent resin filled in the through hole and covering the light-emitting surface of the light-emitting element. With this constitution, in which the light-emitting surface of the light-emitting element is covered with the transparent resin, an increased quantity of light beams can be taken out from the light-emitting element for the reason mentioned later in Embodiment 1. Further, the light-emitting surface can be shielded from the outside air, so that its degradation with time can be retarded.

In the above constitution in which the transparent resin is filled in the through hole, the first optical transmitter may further comprise a lens bonded by the transparent resin filled in the through hole so that the lens faces the through hole of the substrate.

In the above constitution in which the transparent resin is filled in the through hole, the transparent resin preferably has a hardness of 50 degrees or lower according to JIS-A. With this constitution, in which the transparent resin has resiliency, thermal stress created on the light-emitting element can be reduced, so that the first optical transmitter can be used over a wide temperature range. If a lens is provided, thermal stress created on the lens can be reduced, so that the first optical transmitter can be used over a wide temperature range.

The first optical transmitter according to the present invention may further comprise a light-transmissive resin member provided on the front surface side of the substrate so as to be filled in the through hole, the light-transmissive resin member having a lens formed as a part thereof for collecting light beams radiated from the light-emitting element. With this constitution, an increased quantity of light beams can be taken out from the light-emitting element for the reason mentioned later in Embodiment 1.

In the structure in which the light-transmissive resin member is provided on the front surface side of the substrate, the substrate may have a resin-injection groove formed in the front surface thereof, the resin-injection groove communicating with the through hole for facilitating the flow of a light-transmissive resin into the through hole at the formation of the light-transmissive resin member.

In another aspect, the present invention provides a second optical transmitter comprising: a substrate having an opening; a submount attached to the substrate and having a through hole; and a light-emitting element disposed on a rear surface of the submount and having a light-emitting portion, the through hole having an inner wall, the through hole having an inside diameter increasing from a rear surface side of the submount toward a front surface side thereof, the light-emitting element disposed so that the light-emitting portion is exposed within the through hole, the light-emitting portion radiating light beams toward the opening of the substrate, the through hole being such that part of the light beams goes out the through hole and enters the opening of the substrate without being reflected, and that the other light beams goes out the through hole into the opening of the substrate after being reflected from the inner wall thereof.

The second optical transmitter according to the present invention provides the same effect as is obtained by the first optical transmitter in which the through hole is formed in the substrate. Unlike the substrate, the submount will suffice if it is of such a size that the light-emitting element can be disposed thereon, so that the amount of a material for the submount can be less. Therefore, even the use of an expensive material for the submount does not significantly affect the cost, but rather provides a favorable effect of further improving heat dissipation of the light-emitting element.

In the second optical transmitter according to the present invention, a difference in linear expansivity between the submount and the light-emitting element may be set smaller than a difference in linear expansivity between the substrate and the light-emitting element. With this constitution, the light-emitting element is arranged close to the submount having a linear expansivity similar to that of the light-emitting element. As a result, thermal stress created on the submount can be reduced, so that the first optical transmitter can be used over a wide temperature range.

In the second optical transmitter according to the present invention, the submount may be made of silicon, the silicon anisotropically etched to form the through hole. With this constitution, the through hole can be provided with the inner wall excellent in plane accuracy and thus in reflection performance.

In the second optical transmitter according to the present invention, the substrate may be a lead frame for providing a connection to an outside electric circuit.

In the second optical transmitter according to the present invention, the light-emitting element may include an electrode provided around the light-emitting portion, the electrode electrically connected to the rear surface of the submount. With this constitution, in which the electrode is provided around the light-emitting portion, the electrode is in surface-to-surface contact with the rear surface of the submount, which is a heat-dissipating medium. Heat generated at the light-emitting portion, therefore, can be quickly transmitted to the submount. Thus, heat dissipation of the light-emitting element is further improved.

In the second optical transmitter according to the present invention, wherein the through hole may comprise a first inner-wall portion provided on the rear surface side of the submount and a second inner-wall portion provided on the front surface side of the submount, the first inner-wall portion having an inside diameter gradually increasing toward the front surface side of the submount, the second inner-wall portion having an inside diameter greater than a maximum inside-diameter of the first inner-wall portion.

With this constitution, the through hole can be formed by forming the second inner-wall portion, having a greater inside diameter, and then forming the first inner-wall portion. Thus, the processability of the through hole is improved. Also, by employing a thick submount, heat dissipation of the light-emitting element can be improved.

In the second optical transmitter according to the present invention, the inner wall of the through hole may be concavely curved. With this constitution, the optical path of a light beam radiated from the light-emitting element can be easily changed so that the light beam rises from the substrate substantially perpendicularly irrespective of the radiation angle of the light beam. Thus, the coupling efficiency can be further increased.

In the second optical transmitter according to the present invention, the submount has a thickness of 50 to 500 µm. With this constitution, miniaturization of the optical transmitter can be achieved. The reason why such a thin submount can be used is the same as is the case of the first optical transmitter in which the through hole is formed in the substrate.

The second optical transmitter according to the present invention may further comprise an auxiliary substrate arranged so that the light-emitting element is sandwiched between the auxiliary substrate and the submount, the light-emitting element having a rear electrode on a rear surface thereof opposite the light-emitting portion, the rear electrode electrically connected to the auxiliary substrate. With this constitution, the rear electrode of the light-emitting element is in surface-to-surface contact with the auxiliary substrate. Heat generated at the light-emitting portion, therefore, is dissipated not only from the light-emitting portion but also from the rear surface. Thus, heat dissipation of the light-emitting element is further improved.

The second optical transmitter according to the present invention may further comprise an encapsulating resin-member provided on a rear surface side of the substrate for encapsulating the submount and the light-emitting element. With this constitution, the light-emitting element and the submount can be shielded from the outside air, so that its degradation with time can be retarded.

In the above constitution in which the encapsulating resin-member is provided, the encapsulating resin-member may be made of a resin, the resin containing a filler for lowering a linear expansivity of the encapsulating resin-member and for raising a thermal conductivity thereof. With this constitution, in which the filler is contained in the resin, which forms the encapsulating resin-member, the linear expansivity and the thermal conductivity of the resin can be easily changed so as to reduce thermal stress created on the light-emitting element and on the submount and to improve heat dissipation of the light-emitting element and the submount. Also, the encapsulating resin-member is provided in an area other than the optical path of the optical element, so that thermal stress and heat dissipation can be improved without damaging the optical properties.

The second optical transmitter according to the present invention may further comprise a transparent resin filled in the through hole and in the opening and covering the light-emitting surface of the light-emitting element. With this constitution, in which the light-emitting surface of the light-emitting element is covered with the transparent resin, an increased quantity of light beams can be taken out from the light-emitting element for the reason mentioned later in Embodiment 1. Further, the light-emitting surface can be shielded from the outside air, so that its degradation with time can be retarded.

In the above constitution in which the transparent resin is filled in the through hole and in the opening, the second optical transmitter may further comprise a lens bonded by the transparent resin filled in the through hole and in the opening so that the lens faces the opening of the substrate.

In the above constitution in which the transparent resin is filled in the through hole and in the opening, the transparent resin preferably has a hardness of 50 degrees or lower according to JIS-A. With this constitution, in which the transparent resin has resiliency, thermal stress created on the light-emitting element can be reduced, so that the second optical transmitter can be used over a wide temperature range. If a lens is provided, thermal stress created on the lens can be reduced, so that the second optical transmitter can be used over a wide temperature range.

The second optical transmitter according to the present invention may further comprise a light-transmissive resin member provided on a front surface side of the substrate so as to be filled in the through hole and in the opening, the light-transmissive resin member having a lens formed as a part thereof for collecting light beams radiated from the light-emitting element. With this constitution, an increased quantity of light beams can be taken out from the light-emitting element for the reason mentioned later in Embodiment 1.

In the constitution in which the light-transmissive resin member is provided on a front surface side of the substrate, the substrate may have a resin-injection groove formed in the front surface thereof, the resin-injection groove communicating with the opening for facilitating the flow of a light-transmissive resin into the opening and into the through hole communicating therewith at the formation of the light-transmissive resin member.

In still another aspect, the present invention provides a third optical transmitter comprising: a substrate having a first through hole; a submount attached to the substrate and having a second through hole; and a light-emitting element disposed on a rear surface of the submount and having a light-emitting portion, the first through hole having an inner wall, the first through hole having an inside diameter increasing from a rear surface side of the substrate toward a front surface side thereof, the second through hole having an inner wall, the second through hole having an inside diameter increasing from a rear surface side of the mount toward a front surface side thereof, the light-emitting element disposed so that the light-emitting portion is exposed within the second through hole, the light-emitting portion radiating light beams toward a front surface of the substrate, the first through hole and the second through hole being such that part of the light beams goes out the first through hole without being reflected, and that the other light beams go out the first through hole after being reflected from at least one of the inner wall of the substrate and the inner wall of the submount.

The third optical transmitter according to the present invention provides the same effect as is obtained by the first optical transmitter, in which the through hole is formed in the substrate alone, or by the second optical transmitter in which the through hole is formed in the submount alone. Especially because the two through holes can be given different shapes, arbitrarily selecting the shape of each through hole depending on the radiation pattern of the light-emitting element makes it is possible to obtain an effect that the transmission efficiency can be further improved. In the third optical transmitter according to the present invention, the first through hole communicate with the second through hole, and preferably, the first through hole has a minimum inside diameter the same as or slightly greater than a maximum inside diameter of the second through hole.

In the third optical transmitter according to the present invention, a difference in linear expansivity between the submount and the light-emitting element may be set smaller than a difference in linear expansivity between the substrate and the light-emitting element. With this constitution, the light-emitting element is arranged close to the submount having a linear expansivity similar to that of the light-emitting element. As a result, thermal stress created on the submount can be reduced, so that the first optical transmitter can be used over a wide temperature range.

In the third optical transmitter according to the present invention, an angle formed between the inner wall of the first through hole and an optical axis of the light-emitting element may be set smaller than an angle formed between the inner wall of the second through hole and the optical axis of the light-emitting element. With this constitution, of light beams radiated from the light-emitting portion, a light beam having a wide radiation angle is applied onto the inner wall of the second through hole, while a light beam having a narrow radiation angle is applied onto the inner wall of the first through hole. By setting the angle formed between the inner wall of the first through hole and the optical axis of the light-emitting element smaller than the angle formed between the inner wall of the second through hole and the optical axis of the light-emitting element, the optical paths of the light beam having a wide radiation angle and the light beam having a narrow radiation angle emitted from the light-emitting element light-emitting element both can be changed perpendicularly with respect the light-emitting surface of the light-emitting element. Thus, high transmission efficiency can be obtained.

In the third optical transmitter according to the present invention, the submount may be made of silicon, the silicon anisotropically etched to form the through hole. With this constitution, the submount can be provided with the inner wall excellent in plane accuracy and thus in reflection performance.

In the third optical transmitter according to the present invention, the light-emitting element may include an electrode provided around the light-emitting portion, the electrode electrically connected to the rear surface of the submount. With this constitution, in which the electrode is provided around the light-emitting portion, the electrode is in surface-to-surface contact with the rear surface of the submount, which is a heat-dissipating medium. Heat generated at the light-emitting portion, therefore, can be quickly transmitted to the submount. Thus, heat dissipation of the light-emitting element is further improved.

In the third optical transmitter according to the present invention, the substrate may be a lead frame for providing a connection to an outside electric circuit.

In the third optical transmitter according to the present invention, the first through hole may comprise a first inner-wall portion provided on the rear surface side of the substrate and a second inner-wall portion provided on the front surface side of the substrate, the first inner-wall portion having an inside diameter gradually increasing toward the front surface side of the substrate, the second inner-wall portion having an inside diameter greater than a maximum inside-diameter of the first inner-wall portion. With this constitution, the first through hole can be formed by forming the second inner-wall portion, having a greater inside diameter, and then forming the first inner-wall portion. Thus, the processability of the first through hole is improved. Also, by employing a thick substrate, heat dissipation of the light-emitting element can be improved.

In the third optical transmitter according to the present invention, the second through hole may comprise a first inner-wall portion provided on the rear surface side of the submount and a second inner-wall portion provided on the front surface side of the submount, the first inner-wall portion having an inside diameter gradually increasing toward the front surface side of the submount, the second inner-wall portion having an inside diameter greater than a maximum inside-diameter of the first inner-wall portion. With this constitution, the second through hole can be formed by forming the second inner-wall portion, having a greater inside diameter, and then forming the first inner-wall portion. Thus, the processability of the second through hole is improved. Also, by employing a thick submount, heat dissipation of the light-emitting element can be improved.

In the third optical transmitter according to the present invention, the inner wall of either the first through hole or the second through hole may be concavely curved. With this constitution, the optical path of a light beam radiated from the light-emitting element can be easily changed so that the light beam rises from the substrate substantially perpendicularly irrespective of the radiation angle of the light beam. Thus, the coupling efficiency can be further increased.

In the third optical transmitter according to the present invention, the substrate and the submount each may have a thickness of 50 to 500 µm. With this constitution, miniaturization of the optical transmitter can be achieved. The reason why such a thin submount and a substrate can be used is the same as is the case of the first optical transmitter in which the through hole is formed in the substrate.

The third optical transmitter according to the present invention may further comprise an auxiliary substrate arranged so that the light-emitting element is sandwiched between the auxiliary substrate and the submount, the light-emitting element having a rear electrode on a rear surface thereof opposite the light-emitting portion, the rear electrode electrically connected to the auxiliary substrate. With this constitution, the rear electrode of the light-emitting element is in surface-to-surface contact with the auxiliary substrate. Heat generated at the light-emitting portion, therefore, is dissipated not only from the light-emitting portion but also from the rear surface. Thus, heat dissipation of the light-emitting element is further improved.

The third optical transmitter according to the present invention may further comprise an encapsulating resin-member provided on the rear surface side of the substrate for encapsulating the submount and the light-emitting element. With this constitution, the light-emitting element and the submount can be shielded from the outside air, so that its degradation with time can be retarded.

In the above constitution in which the encapsulating resin-member is provided, the encapsulating resin-member may be made of a resin, the resin containing a filler for lowering a linear expansivity of the encapsulating resin-member and for raising a thermal conductivity thereof. With this constitution, in which the filler is contained in the resin, which forms the encapsulating resin-member, the linear expansivity and the thermal conductivity of the resin can be easily changed so as to reduce thermal stress created on the light-emitting element and on the submount and to improve heat dissipation of the light-emitting element and the submount. Also, the encapsulating resin-member is provided in an area other than the optical path of the optical element, so that thermal stress and heat dissipation can be improved without damaging the optical properties.

The third optical transmitter according to the present invention may further comprise a transparent resin filled in the first through hole and in the second through hole and covering the light-emitting surface of the light-emitting element. With this constitution, in which the light-emitting surface of the light-emitting element is covered with the transparent resin, an increased quantity of light beams can be taken out from the light-emitting element for the reason mentioned later in Embodiment 1. Further, the light-emitting surface can be shielded from the outside air, so that its degradation with time can be retarded.

In the above constitution in which the transparent resin is provided, the third optical transmitter may further comprise a lens bonded by the transparent resin filled in the first through hole and in the second through hole so that the lens faces the first through hole of the substrate.

In the above constitution in which the transparent resin is provided, the transparent resin preferably has a hardness of 50 degrees or lower according to JIS-A. With this constitution, in which the transparent resin has resiliency, thermal stress created on the light-emitting element can be reduced, so that the first optical transmitter can be used over a wide temperature range. If a lens is provided, thermal stress created on the lens can be reduced, so that the first optical transmitter can be used over a wide temperature range.

The third optical transmitter according to the present invention may further comprise a light-transmissive resin member provided on a front surface side of the substrate so as to be filled in the first through hole and in the second through hole, the light-transmissive resin member having a lens formed as a part thereof for collecting light beams radiated from the light-emitting element. With this constitution, an increased quantity of light beams can be taken out from the light-emitting element for the reason mentioned later in Embodiment 1.

In the above constitution in which the light-transmissive resin member is provided on the front surface side of the substrate, the substrate may have a resin-injection groove formed in the front surface thereof, the resin-injection groove communicating with the first through hole for facilitating the flow of a light-transmissive resin into the first through hole and into the second through hole communicating therewith at the formation of the light-transmissive resin member.

In yet another aspect, the present invention provides an illumination device comprising a plurality of optical transmitters arranged side by side, each optical transmitters as set forth above.

Hereafter, embodiments of the present invention are shown in detail referring to the drawings. In the embodiments, like reference numerals denote members having like functions.

Embodiment 1

FIG. 1 is an explanatory view showing a schematic construction of an optical transmitter according to Embodiment 1 of the present invention.

The optical transmitter 1 comprises a light-emitting element 3, a lens 4 and a lead frame (substrate) 5 disposed on the light-emitting element 3.

The lead frame 5 has a through hole 7 formed in a position facing a light-emitting surface (light-emitting portion) 6 of the light-emitting element 3. The through hole 7 is tapered so that its inside diameter gradually increases from a rear surface side, on which the light-emitting element 3 is disposed, toward a front surface side. The tapered through hole 7 has an inner wall called a taper mirror 8.

Of light beams radiated from the light-emitting element 3, a light beam having a narrow radiation angle passes through the through hole 7 and enters the lens 4 to be refracted and coupled into an optical fiber 2. A light beam having a wide radiation angle of the light beams radiated from the light-emitting element 3, on the other hand, is reflected from the taper mirror 8 and enters the lens 4 to be refracted and coupled into the optical fiber 2.

Therefore, even the use of, for example, an LED having a wide radiation angle as the light-emitting element 3 makes possible coupling of light beams from the light-emitting element 3 into the optical fiber 2 with high efficiency.

The light-emitting element 3 is positioned so that its light-emitting surface 6 faces the through hole 7 of the lead frame 5, and bonded to the lead frame 5 by an electrically conductive adhesive such as a silver paste or with a eutectic of gold and tin or of other materials.

That is, an electrode (see, e.g., a p-electrode 15 of FIG. 3) of the light-emitting element 3 on the light-emitting surface 6 side is electrically continuous with the lead frame 5. The lead frame 5 is electrically continuous with a circuit substrate, not illustrated.

The light-emitting element 3 is covered with a mold resin (light-transmissive resin member) 9 made of, for example, an epoxy resin or an acrylic resin. The lens 4 is also formed of the mold resin 9.

Also, in addition to the light-emitting element 3, a driver IC, not illustrated, for driving the light-emitting element 3, and the like, are disposed on the lead frame 5 and are also encapsulated in the mold resin 9.

If the light-emitting element 3 is one having a relatively wide radiation angle such as an LED, the light-emitting element 3 is preferably covered with the mold resin 9 as shown in FIG. 1.

A light beam from the light-emitting element 3 is refracted due to the difference in refractive index between the surface of the light-emitting element 3 and the outside (air or the mold resin 9) before the light beam is radiated. Therefore, an increased quantity of light beams can be taken out when the light-emitting element 3 is covered with the mold resin 9 than when the light-emitting element 3 is covered with air the refractive index of which is smaller. This is because the angle at which total reflection occurs is a greater when the light-emitting element 3 is covered with the mold resin 9.

For example, changing the refractive index of the outside from 1 to 1.56 achieves about 2.4-fold increase in the quantity of light beams from the light-emitting element 3. Therefore, covering the light-emitting element 3 with the mold resin 9 increases the utility efficiency of light beams. Also, shielding the light-emitting element 3, the driver IC and other components from the outside makes possible retarding degradation with time.

Figure 2:
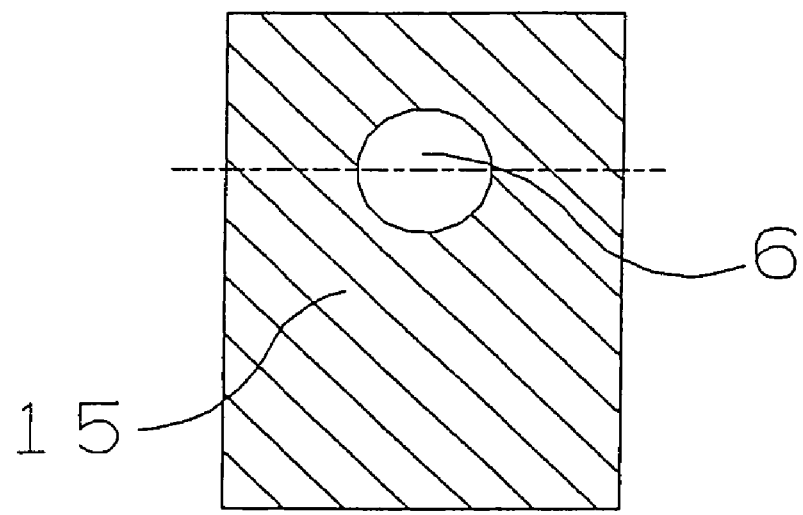
FIG. 2 is a plan view of a light-emitting element used in the optical transmitter of FIG. 1.
Figure 3:
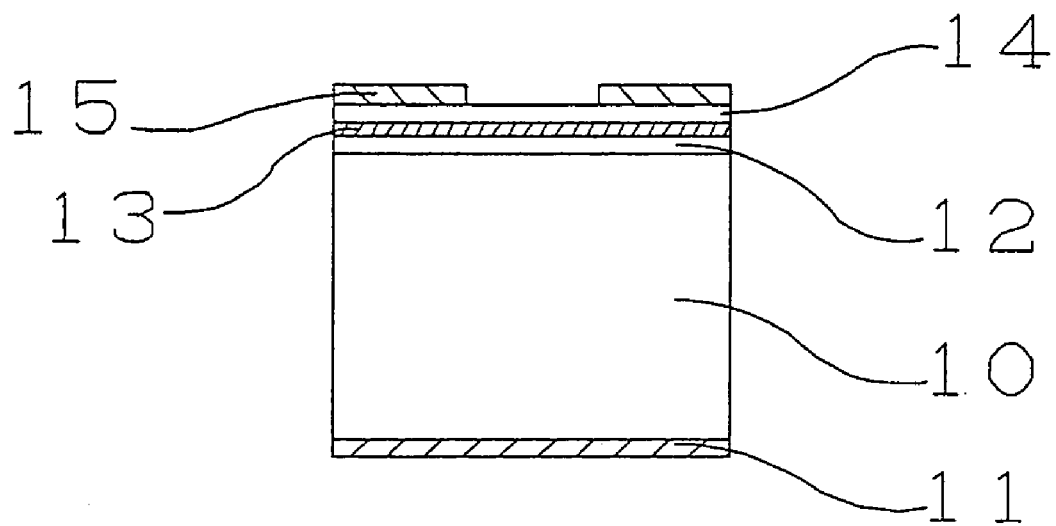
FIG. 3 is a cross sectional view of the light-emitting element of FIG. 2.

The light-emitting element 3 is preferably a light emitting diode (LED) of surface-emitting type. FIG. 2 and FIG. 3 show an LED of traditional double hetero structure.

As shown in FIG. 3, an n-electrode 11 is formed on a lower surface of an n-type substrate 10 made of GaAs or the like. On the n-type substrate 10, there are formed an n-type cladding layer 12, an active layer 13, a p-type cladding layer 14 and the p-electrode 15 in this order.

As shown in FIG. 2 and FIG. 3, in the p-electrode 15, there is formed an opening, from which the light-emitting surface 6 is exposed, and light beams are emitted from the light-emitting surface 6.

The structure and the material of the light-emitting element 3 each are arbitrarily selected depending on the wavelengths and the characteristics demanded. In the below, explanation is made on the premise that the light-emitting element 3 is an LED of the structure shown in FIG. 2 and FIG. 3. However, needless to say, the present invention can also be achieved using the light-emitting element 3 of another structure.

One feature of the present invention is that the through hole 7 in the lead frame 5 has the taper mirror 8 in order for light beams having wide radiation angles to be raised from the surface of the lead frame 5. The taper mirror 8 makes it possible to miniaturize the optical transmitter 1 and reduce the cost thereof and also contributes to increasing the optical transmission efficiency, to reducing the variation in optical transmission efficiency, and to improving heat dissipation of the light-emitting element 3. Hereafter, explanation is given to these effects.

Figure 4:
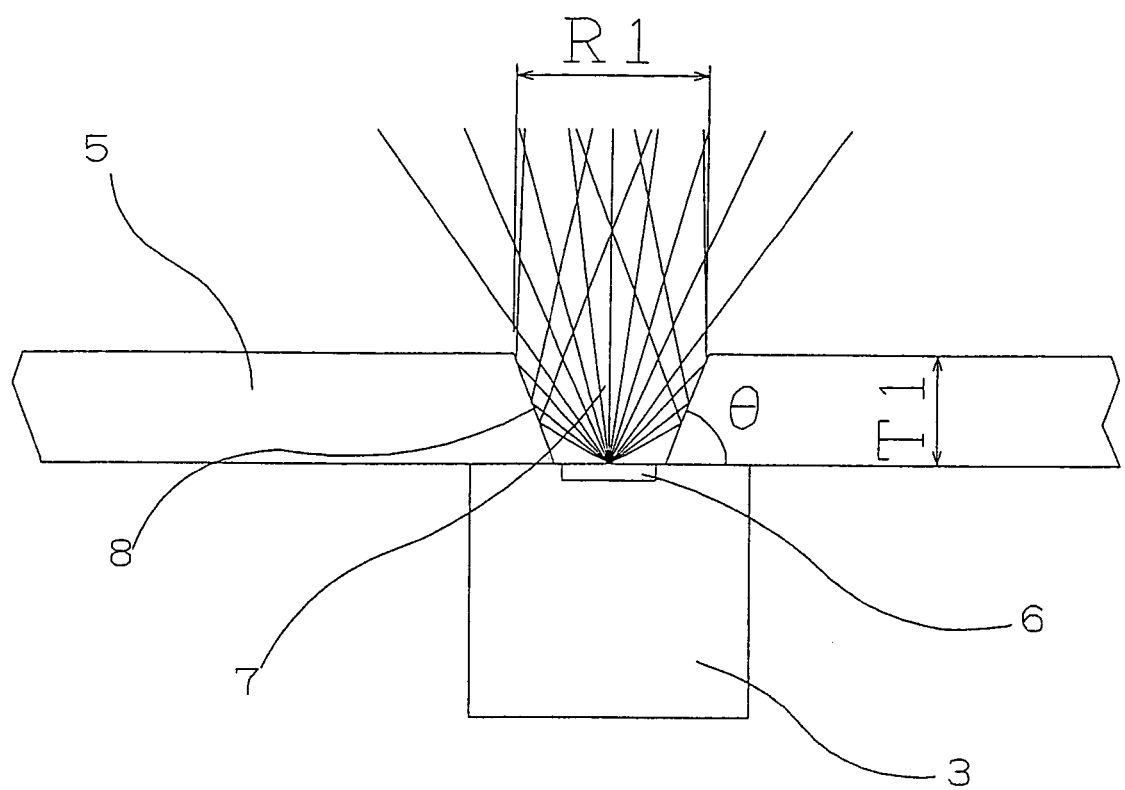
FIG. 4 is an enlarged view of an essential part of the optical transmitter 1 of FIG. 1.
Figure 5:
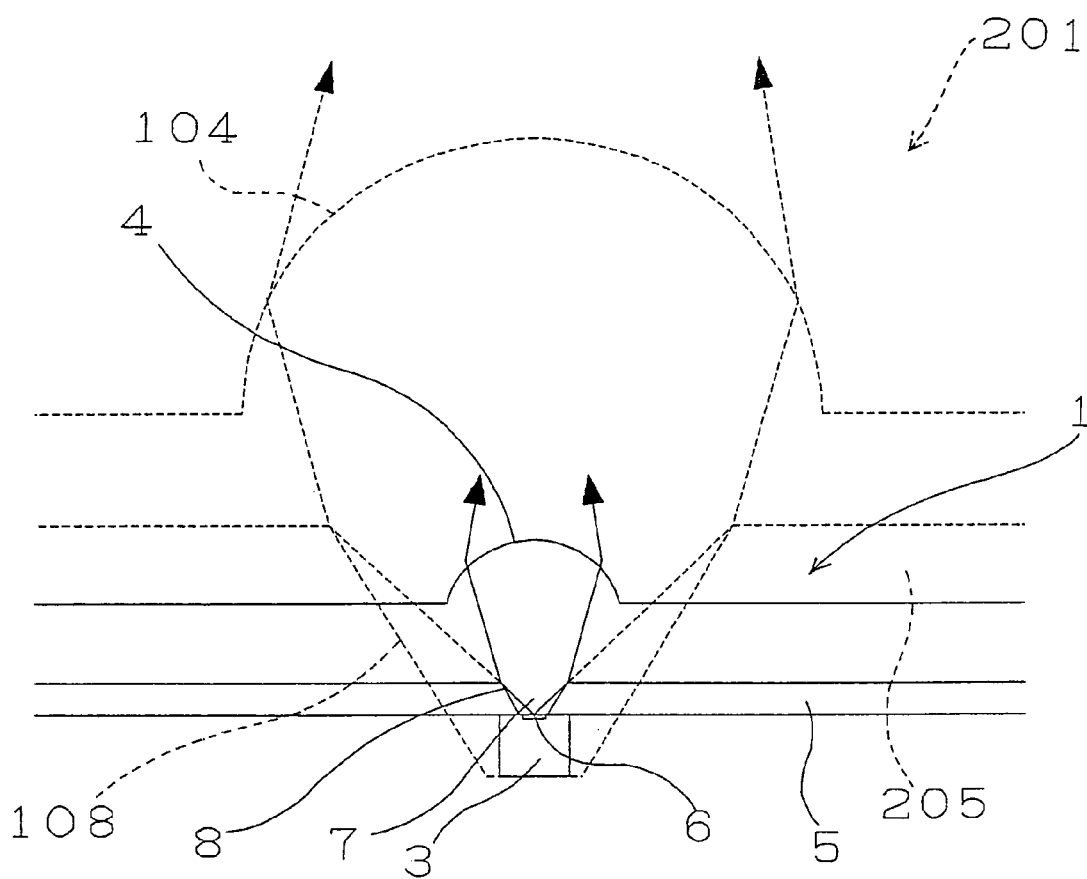
FIG. 5 is an explanatory view in which the size of the optical transmitter 1 according to Embodiment 1 is compared with that of a conventional optical transmitter on the same figure.
Figure 23:
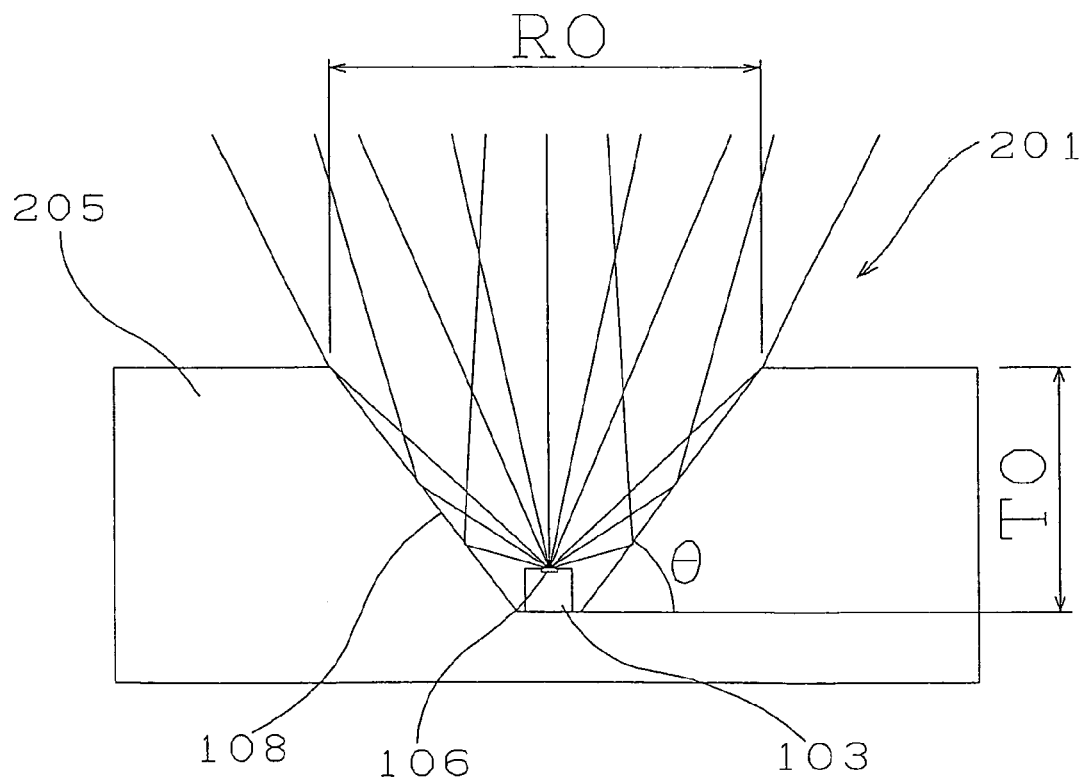
FIG. 23 is an explanatory view showing a schematic construction of the conventional optical transmitter.

Referring to FIG. 1, FIG. 4 and FIG. 5, the size of the optical transmitter 1 according to Embodiment 1 is compared with that of the conventional optical transmitter 201 of FIG. 23 for explanation. FIG. 4 is an enlarged view of an essential part of the optical transmitter 1 of FIG. 1. FIG. 5 is an explanatory view in which the size of the optical transmitter 1 according to Embodiment 1 shown in FIG. 1 is compared with that of the conventional optical transmitter 201 shown in FIG. 23 on the same figure. In FIG. 5, the conventional optical transmitter 201 is indicated by the dashed lines.

As aforementioned, in the conventional optical transmitter 201 shown in FIG. 23, assuming that: the LED 103 is in the shape of a cube with a height of 300 μm and a width of 300 μm; the concave mirror 108 has a taper angle θ of 60°; and the concave portion has an inside diameter of φ 500 μm on the bottom surface side thereof, the concave portion needs to have a depth T0 of about 1.3 mm and an inside diameter R0 of 2 mm on the upper edge side in order for the concave mirror 108 to change the optical path of a light beam having a radiation angle of 45° or wider, of light beams radiated from the center of the light-emitting surface 106 of the LED 103.

On the other hand, in the optical transmitter 1 according to Embodiment 1 shown in FIG. 1, if calculation is made on the assumption that the through hole 7 has an inside diameter of about φ 100 μm on the rear surface side thereof, and that the other conditions are the same as those of the prior art shown in FIG. 23, it is found that, as shown in FIG. 4, a thickness T1 of the lead frame 5, corresponding to the depth T0 (see FIG. 23) of the concave portion of the prior art is 0.12 mm, and an inside diameter R1 of the through hole 7 on the front surface side thereof, corresponding to the inside diameter R0 (see FIG. 23) on the upper edge side of the prior art, is about 0.24 mm. Thus, the present invention achieves a reduction in both thickness and size to about $1/10^{th}$ of the prior art.

As is clear from FIG. 5, according to Embodiment 1 in which the inside diameter R1 of the through hole 7 on the front surface side thereof can be as small as about 0.24 mm, the lens 4 (see FIG. 1) for collecting light beams onto the optical fiber also can have a reduced diameter.

Accordingly, there is a high degree of design freedom of the lens 4, making it easy to obtain the lens 4 which has performance ideal in coupling light beams raised from the front surface side of the through hole 7 into the optical fiber 2 with high efficiency.

Figure 21:
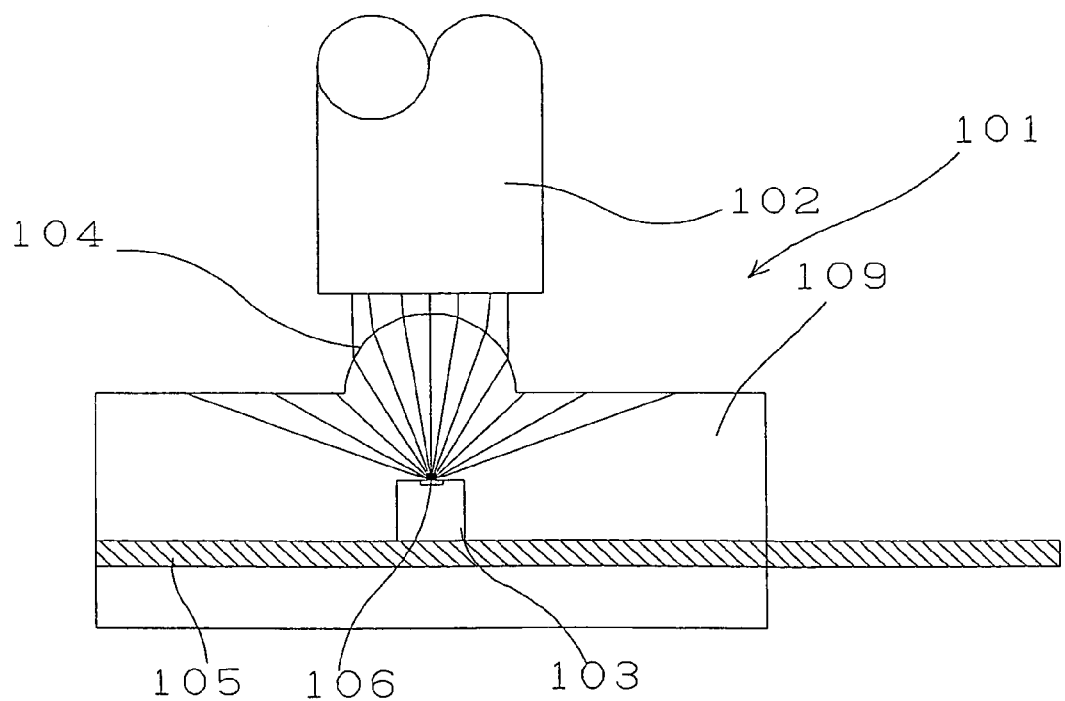
FIG. 21 is an explanatory view showing a schematic construction of a conventional optical transmitter.

Also, the lead frame 5 usually has a thickness of about 0.25 mm, so that the optical transmitter 1 can be of the same size as that of the optical transmitter 101, shown in FIG. 21, which is produced by transfer mold.

On the other hand, with the conventional optical transmitter 201 shown in FIG. 23, in which the inside diameter R0 of the concave portion on the upper edge side thereof is as large as about φ 2 mm, the possibility arises: the use of a lens with a short focal length may cause the failure of light beams to be coupled into the optical fiber because an NA incident to the optical fiber becomes too large, while the use of a lens with a long focal length in order to take an advantage of a small incident NA may make it difficult to miniaturize the optical transmitter inclusive of the optical fiber. Thus, it is difficult to increase the coupling efficiency while achieving miniaturization and cost reduction of the optical transmitter.

Further, there is another problem that a space for wire-bonding an electrode of the LED 103 needs to be provided at a portion of the concave mirror 108, which complicates the production process.

In contrast to this, according to the present invention, in which the taper mirror 8 is arranged significantly close to the light-emitting surface 7, and the lead frame 5 is provided with the taper mirror 8, it is possible to increase the transmission efficiency and miniaturize the optical transmitter 1.

According to the present invention, it is possible to achieve miniaturization of the optical transmitter 1 while increasing the efficiency of coupling from the light-emitting element 3 into the optical fiber 2, which is conventionally difficult.

In the optical transmitter 1 according to Embodiment 1, the through hole 7 can be formed by etching or pressing simultaneously with the patterning-processing of the lead frame 5 without incurring a rise in cost. Accordingly, the optical transmitter 1 can be obtained at a low cost.

Here, it is preferable to form, simultaneously with the formation of the through hole 7, a reference hole, not illustrated, for positioning the light-emitting element 3, the lens 4 and the optical fiber 2 with respect to one another. By using this reference hole as a reference in assembling the optical transmitter 1, it is possible to position the through hole 7, the light-emitting element 3, the lens 4 and the optical fiber 2 with respect to one another.

Next, explanation is given to the through hole 7. The inside diameter of the through hole 7 of the lead frame 5 on the rear surface side is preferably slightly greater or slightly smaller than the diameter of the light-emitting surface 6 of the light-emitting element 3. Whether to make the inside diameter of the through hole 7 greater or smaller is decided depending on whether to assign higher priority to increasing the transmission efficiency or to reducing the variation in transmission efficiency.

If higher priority is assigned to increasing the transmission efficiency, it is preferable to make slightly greater the inside diameter of the through hole 7 on the rear surface side than the diameter of the light-emitting surface 6 of the light-emitting element 3. If the diameter of the light-emitting surface 6 is φ 70 μm for example, the inside diameter of the through hole 7 on the rear surface side is set at about 100 μm. Thus, it is ensured that even if the light-emitting element 3 comes off position with respect to the through hole 7, light beams emitted from the light-emitting surface 6 are not kicked by the lead frame 5, so that all the light beams radiated from the light-emitting surface 6 can be utilized.

On the other hand, if higher priority is assigned to reducing the variation in transmission efficiency, it is preferable to make slightly smaller the inside diameter of the through hole 7 on the rear surface side than the diameter of the light-emitting surface 6 of the light-emitting element 3. If the diameter of the light-emitting surface 6 is φ 70 μm for example, the inside diameter of the through hole 7 on the rear surface side is set at 50 μm. This ensures that even if the light-emitting element 3 comes off position, the quantity of light beams passing through the through hole 7 is less varied, so that the variation in transmission efficiency can be reduced.

Also, in the optical transmitter 1 according to Embodiment 1, the taper mirror 8 can be arranged closer to the light-emitting surface 6 than in the conventional optical transmitter shown in FIG. 23. This ensures that even if the light-emitting element 3 comes off position, the position at which a light beam is raised is less varied, so that the variation in the efficiency of coupling of light beams into the lens 4 and into the optical fiber 2 can be reduced.

Examples of shapes of the through hole 7 include ones shown in FIGS. 6 to 13.

Figure 6:
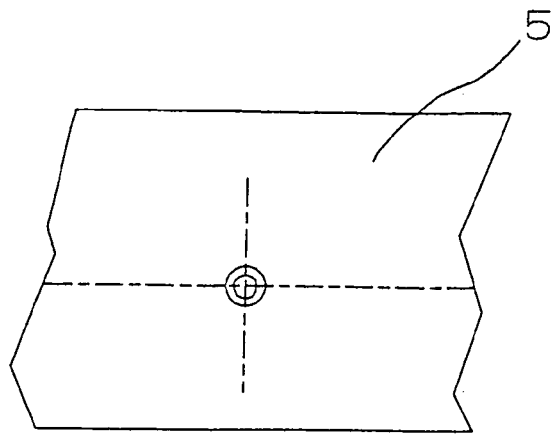
FIG. 6 is a plan view of a through hole formed in a lead frame of the optical transmitter of FIG. 1.
Figure 7:
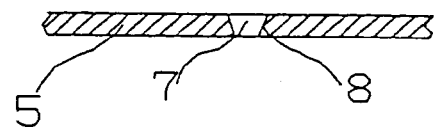
FIG. 7 is a cross sectional view of the through hole of FIG. 6.

The through hole 7 shown in FIGS. 6 and 7, like the one shown in FIG. 1, has the taper mirror 8 of linear cross section.

The taper mirror 8 of linear cross section is easy to process and ensures that, of light beams radiated from the light-emitting element 3, the optical path of even a light beam with a wide radiation angle can be changed.

Here, the taper angle θ (see FIG. 4) is preferably about 40° to 80° to suit the far field pattern of light beams emitted from the light-emitting element 3. The optimal taper angle is decided depending on the far field pattern of light beams emitted from the light-emitting element 3 used.

Figure 8:
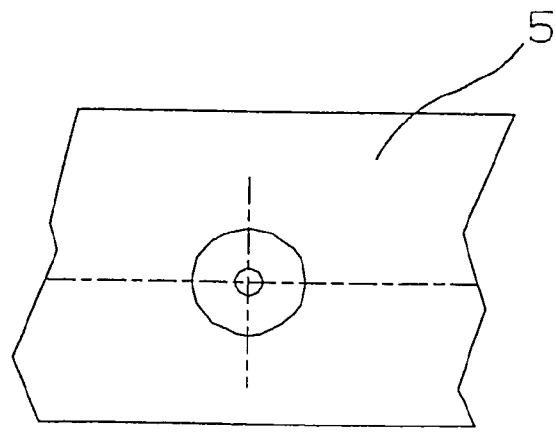
FIG. 8 is a plan view showing a modification of the through hole.
Figure 9:
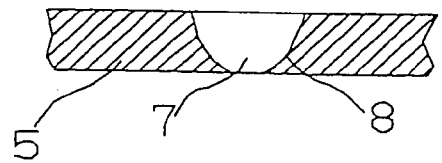
FIG. 9 is a cross sectional view of the through hole of FIG. 8.

Further, the taper mirror 8 is preferably of curved (i.e., concave) cross section as shown in FIGS. 8 and 9.

For example, if the taper mirror 8 is of parabola-shaped cross section and the light-emitting surface 6 is arranged at the focal point of the parabola, it is possible to change the optical path of a light beam radiated from the light-emitting element 3 substantially perpendicularly with respect to the lead frame 5, irrespective of radiation angle of the light beam. Such a curved shape can be obtained by, for example, etching the lead frame 5 from one side.

Figure 10:
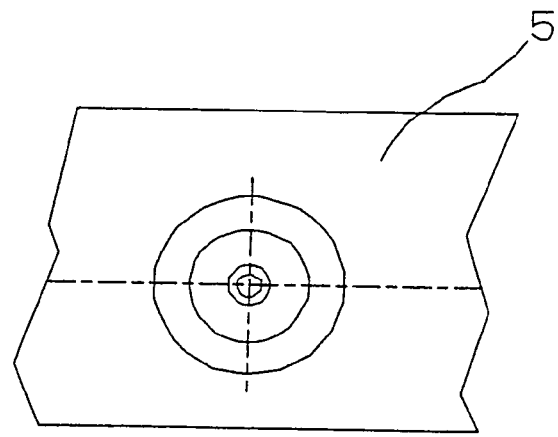
FIG. 10 is a plan view of another modification of the through hole.
Figure 11:
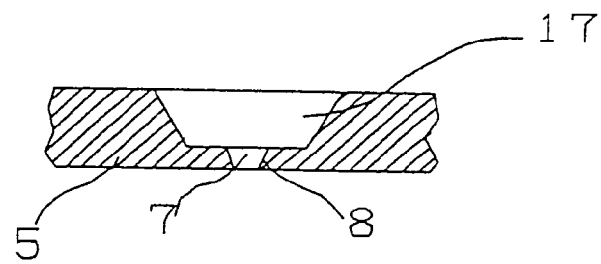
FIG. 11 is a cross sectional view of the through hole of FIG. 10.

Also, the through hole 7 is preferably of the shape shown in FIGS. 10 and 11. That is, the through hole 7 preferably includes a taper mirror (first inner-wall) portion 8 on the rear surface side of the lead frame 5 and an enlarged hole (second inner-wall) portion 17 on the front surface side of the lead frame 5. The taper mirror portion 8 has an inside diameter gradually increasing toward the front surface side of the lead frame 5. The enlarged hole portion 17 has an inside diameter greater than the maximum inside diameter of the taper mirror portion 8.

In the through hole 7 shown in FIGS. 10 and 11, the enlarged hole portion 17 has the effects of improving heat dissipation of the light-emitting element 3 and improving the processability of the taper mirror 8.

That is, it is difficult to process the through hole 7 if the thickness of the lead frame 5 is much greater than the inside diameter of the through hole 7 on the rear surface side, which as mentioned above is about 100 μm. In contrast, as the thickness of the lead frame 5 becomes greater, there is a more advantage in heat dissipation of the light-emitting element 3 and of the driver IC for driving the light-emitting element 3.

Thus, by forming the enlarged hole portion 17 in the lead frame 5 on the front surface side thereof, the processing of the taper mirror portion 8 is facilitated and the lead frame 5 is allowed to have a greater thickness, resulting in an improvement in heat dissipation. The enlarged hole portion 17, which is not irradiated with any light beam, does not have any optical role.

Figure 12:
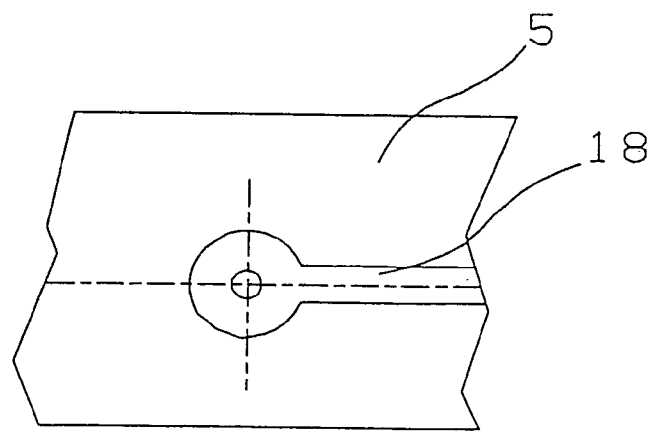
FIG. 12 is a plan view showing still another modification of the through hole.
Figure 13:
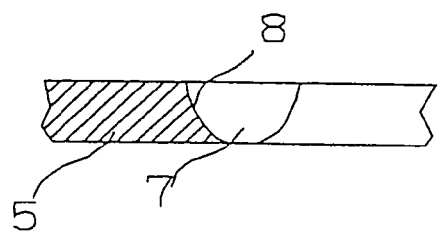
FIG. 13 is a cross sectional view of the through hole of FIG. 12.

It is preferable to form a resin-injection groove 18 in the front surface side of the lead frame 5 in such a manner that the resin-injection groove 18 communicates with the through hole 7 as shown in FIGS. 12 and 13.

That is, forming the resin-injection groove 18 eliminates the difficulty caused in flowing the resin into the through hole 7 for mold encapsulation with the mold resin 9 as shown in FIG. 1. Thus, the mold encapsulation is ensured. The enlarged hole portion 17 shown in FIGS. 10 and 11 provides the same effect as obtained by the resin-injection groove 18.

Further, it is preferable to set the thickness and the taper angle of the lead frame 5 so that a light beam is reflected from the taper mirror 8 only once. In the case of the so-called optical wave-guide or the like utilizing a plurality of reflections, a greater loss is produced due to the reflections, and the length (equivalent to the thickness of the lead frame 5) is increased, which results in upsizing of devices.

According to the present invention, the shape of the through hole 7 can be modified in various ways as described above, though the depth of the through hole 7 is preferably set at 50 to 500 μm.

That is, according to the present invention, since the taper mirror 8 can be arranged close to the light-emitting surface 6, the through hole 7 ensures a sufficient effect in changing the optical path of a light beam with a wide radiation angle even if the depth of the through hole 7 is small.

Also, when seen from the front surface or the rear surface of the lead frame 5, the through hole 7 does not necessarily need to be circular in shape but may be elliptical or square. The through hole 7 is advantageously of a shape other than a circular shape if there is, for example, distortion in the far field pattern of light beams from the light-emitting element 3.

According to the present invention, as described above, the light-emitting element 3 is disposed on the rear surface side of the lead frame 5. The through hole 7 is basically of tapered cross section so that its inside diameter thereof gradually increases from the rear surface side of the lead frame toward the front surface side thereof.

Also, the inside diameter of the through hole 7 on the rear surface side is set smaller than the size of the light-emitting element 3 chip. As the inside diameter of the through hole 7 is reduced when compared with the size of the light-emitting element 3 chip, the contact area between the light-emitting element 3 and the lead frame 5 increases.

It is important in improving heat dissipation of the light-emitting element 3 that the light-emitting element 3 is disposed so that the light-emitting surface 7 faces the lead frame 5 and that there is a large contact area between the light-emitting element 3 and the lead frame 5.

That is, the thermal resistance of the n-type substrate 10 becomes a problem when using the LED shown in FIGS. 2 and 3 as the light-emitting element 3.

If heat is dissipated from the rear surface side (n-electrode 11 side) of the LED, heat generated at the active layer 13 is dissipated via the n-type substrate 10 and further via the n-electrode 11 into the lead frame 5 and the like, which are each made of a material good in heat dissipation.

Since the n-type substrate 10 is usually made of a material having a high thermal resistance such as GaAs, the LED itself is poor in heat dissipation, resulting in an increased temperature of the active layer 13.

In contrast, in the present invention, in which the light-emitting surface 7 faces the lead frame 5, heat generated at the active layer 13 can be dissipated via the p-type cladding layer 14 and then via the p-electrode 15 into the lead frame 5. When compared with the thermal conductivity of, for example, GaAs, which is 45 W/m·K, the thermal conductivity of the lead frame 5 (copper) is as high as about 360 W/m·K. Further, since the p-type cladding layer 14 and the p-electrode 15 each have a thickness of about several μm, heat dissipation is significantly improved when compared with the case where heat is dissipated via the n-type substrate 10 having a thickness of several hundreds of μm.

The light-emitting element 3 and the lead frame 5 are preferably bonded together by, for example, an adhesive having high conductivity such as a silver paste, or a eutectic of either gold and tin or of other materials. Also, among adhesives having high conductivity, more preferable are ones that ensure sufficient thermal contact with a material having a high thermal conductivity or with a material in the form of a thin layer and also that absorb the difference in linear expansivity between the lead frame 5 and the light-emitting element 3.

Here, it is necessary to avoid sticking of the adhesive to the light-emitting surface 6 of the light-emitting element 3. A thin layer of the adhesive may be formed beforehand over an area of the light-emitting element 3 other than the light-emitting surface 6 by photolithography or another technique so that sticking of the adhesive to the light-emitting surface 6 is avoided. Alternatively, if the eutectic either of gold and tin or of other materials is used, the light-emitting element 3 and the lead frame 5 may be bonded together by plating the surface of the lead frame 5 with gold and forming a gold-tin film on the p-electrode 15 of the light-emitting element 3, followed by thermocompression bonding.

Hereafter, explanation is given to each component.

The optical fiber 2 is preferably a multimode optical fiber such as a plastic optical fiber (POF: polymer optical fiber) or a quartz glass optical fiber (GOF: glass optical fiber).

The core of the POF is made of plastic having excellent optical transmission properties such as PMMA (polymethylmethaacrylate) or polycarbonate and the cladding thereof is made of plastic lower in refractive index than the plastic of the core.

In the POF, it is easier than in the GOF to increase the diameter of the core from about 200 im to about 1 mm and thus easier to adjust the coupling with the optical transmitter. Consequently, it is possible to obtain an inexpensive optical communications link.

Alternatively, the optical fiber 2 may be a PCF (polymer clad fiber) in which the core is made of a quartz glass and the cladding is made of a polymer.

On the other hand, the GOF is more expensive than the POF though the GOF suffers a smaller loss of transmission and provides a wider band of transmission than the POF. Thus, if the GOF is used as a transmission medium, it is possible to obtain an optical communications link that can afford longer-distance communication and higher-speed communications.

The light-emitting element 3 is of surface-emitting type and may be a light-emitting diode (LED), a surface emitting laser (VCSEL) or the like.

The wavelength of the light-emitting element 3 is preferably one that produces a smaller loss of transmission of light beams into the optical fiber 2 used.

For example, if the POF is used as the optical fiber 2, the wavelength of the light-emitting element 3 may be about 650 nm, while if the GOF is used as the optical fiber 2, the wavelength of the light-emitting element 3 may be about 850 nm.

The lead frame 5 is obtained by forming the through hole 7 in a thin plate of a metal having a high thermal conductivity such as copper or phosphor bronze by means of etching, pressing or cutting, followed by plating its surface with silver, gold or the like to obtain high reflectance.

Here, the lead frame 5 means a thin plate of a metal that is disposed on and supports components such as the light-emitting element 3 and the driver IC and that plays a role of transmitting electricity to each component. Of course, the lead frame 5 may be replaced with various substrates such as a stem and a printed substrate.

Embodiment 2

Figure 14:
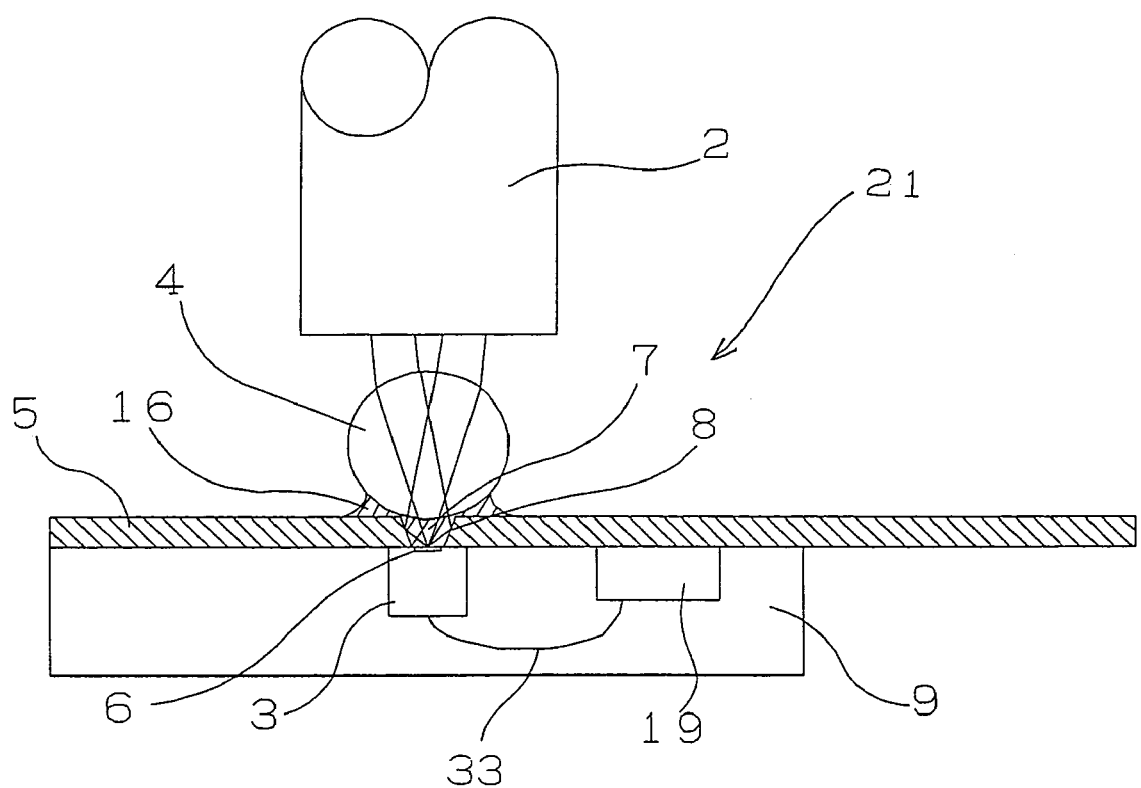
FIG. 14 is an explanatory view showing a schematic construction of an optical transmitter according to Embodiment 2 of the present invention.

A modification of the above optical transmitter according to Embodiment 1 is given as an optical transmitter according to Embodiment 2 and explained referring to FIG. 14. FIG. 14 is an explanatory view showing a schematic structure of the optical transmitter according to Embodiment 2.

As shown in FIG. 14, in the optical transmitter 21 according to Embodiment 2, the lens 4 is not formed of the mold resin (encapsulating resin member) 9. The mold resin 9 covers only the rear surface side of the lead frame 5 on which the light-emitting element 3 is disposed. The light-emitting element 3 and a driver IC 19 are encapsulated in the mold resin 9 and protected from outside air. The light-emitting element 3 and the driver IC 19 are electrically connected together with a bonding wire 33 (though in the reality there are a plurality of bonding wires 33, omission is made in the figure).

The lens 4 can be a ball lens made of a glass, an acrylic resin or the like. The ball lens as the lens 4 is positioned with respect to the through hole 7 of the lead frame 5 and bonded thereto by an adhesive (transparent resin) 16.

The adhesive 16 is made of a material having transparency in the range of wavelengths of the light-emitting element 3. The adhesive 16 is filled in the through hole 7 and covers the light-emitting surface of the light-emitting element 3. Since the through hole 7 is filled with the adhesive 16, the refractive is increased when compared with the case where the air covers the through hole so that an increased quantity of light beams can be out taken from the light-emitting element 3.

The adhesive 16 is preferably made of a material having resiliency. The lead frame 5 is made of a metal such as copper and thus is generally significantly different from the adhesive 16 in linear expansivity. Accordingly, if the ambient temperature changes, a great thermal stress is created at the interfaces between the adhesive 16 and the lead frame 5 and between the light-emitting element 3 and the adhesive 16, the adhesive 16 easily comes off. By using the adhesive 16 made of, for example, a material having resiliency (i.e., a material having a low Young's modulus) such as silicone, thermal stress can be reduced to prevent the adhesive 16 from coming off. For the resiliency of the adhesive 16, the adhesive 16 preferably has a hardness of 50 degrees or lower according to JIS-A. Alternatively, the adhesive 16 preferably has a Young's modulus of 10 MPa or lower.

Further, the lens 4 is preferably bonded by the adhesive 16 having resiliency. Though thermal stress is also created on the lens 4 due to a change in ambient temperature, the resiliency of the adhesive 16 serves to reduce thermal stress to make it difficult for the lens 4 to come off.

Also, the mold resin 9 does not need to be transparent, and for example, materials having a high thermal conductivity, materials having a linear expansivity similar to that of the light-emitting element 3 and to that of the bonding wire 33, as well as inexpensive materials can be used. A transparent mold resin (in the case of an epoxy resin, generally, linear expansivity: 60 to 65 ppm/K, thermal conductivity: about 0.2 W/m·K) is greater in linear expansivity than the light-emitting element 3 (in the case of GaAs, linear expansivity: 6 ppm/K) and than the bonding wire (in the case of gold, linear expansivity: about 14 ppm/K). Thus, great thermal stress is created on the light-emitting element 3 and the bonding wire 33. For this reason, the resin for molding is preferably a resin containing a filler having a low linear expansivity such as silica. Such a resin can be a resin in black color (linear expansivity: 15 to 20 ppm/K, thermal conductivity: about 0.7 W/m·K), which is generally used in packaging of ICs that require no optical properties. Such resins are in general use and thus available at a low cost. According to the present invention, the difference between each one of the light-emitting element 3 and bonding wire 33 and the mold resin 9 in linear expansivity can be significantly reduced, so that thermal stress created on the light-emitting element 3 and the bonding wire 33 can be reduced. Since the filler is contained, the thermal conductivity of the resin itself is increased with the result that heat dissipation of the light-emitting element 3 and of the driver IC 19 also can be improved. Consequently, the function and the reliability of the optical transmitter 1 can be further improved and the cost thereof can be further reduced. For example, rupture of the wire resulting from a difference in linear expansivity between the lead frame 5 and the mold resin 9 can be prevented.

Embodiment 3

Figure 15:
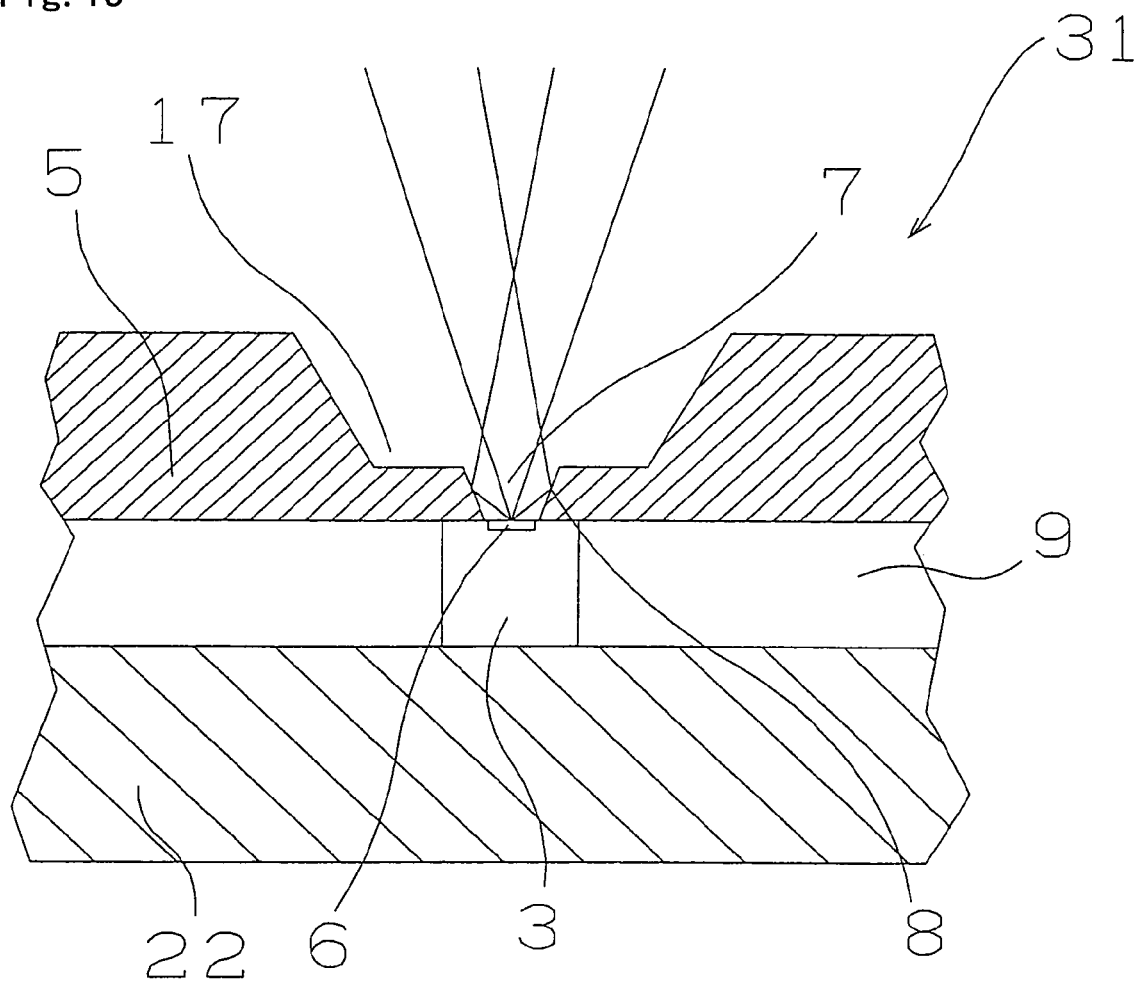
FIG. 15 is an enlarged view of an essential part of an optical transmitter according to Embodiment 3 of the present invention.

Another modification of the above optical transmitter according to Embodiment 1 is given as an optical transmitter according to Embodiment 3 and explained referring to FIG. 15. FIG. 15 is an enlarged view of an essential part of the optical transmitter according to Embodiment 3.

As shown in FIG. 15, in the optical transmitter 31 according to Embodiment 3, the through hole 7 is of the shape shown in FIGS. 10 and 11.

A light beam emitted from the light-emitting element is reflected from the taper mirror portion 8, without being applied onto the inner wall of the enlarged hole portion 17, so that the optical path of the light beam is changed.

As aforementioned, this constitution allows the lead frame 5 to have an increased thickness so that heat dissipation is improved, and further that the effect of the mold resin (light-transmissive resin member) 9 or the adhesive (transparent resin) 16 easily flowing into the through hole 7 can be obtained.

Also, the light-emitting element 3 has, on its rear surface opposite the light-emitting surface 6, the electrode (see the n-electrode 11 of FIG. 3) bonded to a rear-electrode substrate (auxiliary substrate) 22 by an electrically conductive adhesive such as a silver paste.

The lead frame 5 and the rear-electrode substrate 22 each are electrically connected to an electric circuit, not illustrated, for the on/off control of the light-emitting element 3.

The rear-electrode substrate 22 is made of a metal having a high thermal conductivity such as aluminum, copper or phosphor bronze.

That is, the light-emitting element 3 is not electrically connected by an elongate member such as a wire. Instead, the electrode (see the p-electrode 15 of FIG. 3) of the light-emitting element 3 on the light-emitting surface 6 side and the electrode thereof on the rear surface side are in surface-to-surface contact with the lead frame 5 and the rear-electrode substrate 22, respectively. Accordingly, heat generated at the light-emitting element 3 can be dissipated efficiently, significantly improving heat dissipation.

In Embodiment 3, as in the case of Embodiment 1, the mold resin (light-transmissive resin member) may be provided on the front surface side of the lead frame 5 so as to be filled in the through hole 7 and in the enlarged hole portion 17 and to have the lens formed as an integral part of the mold resin. Alternatively, as in Embodiment 2, the adhesive (transparent resin) may be filled in the through hole 7 and in the enlarged hole portion 17 and cover the light-emitting surface 6 of the light-emitting element 3 to bond the lens so that the lens faces the enlarged hole portion 17.

Embodiment 4

Figure 16:
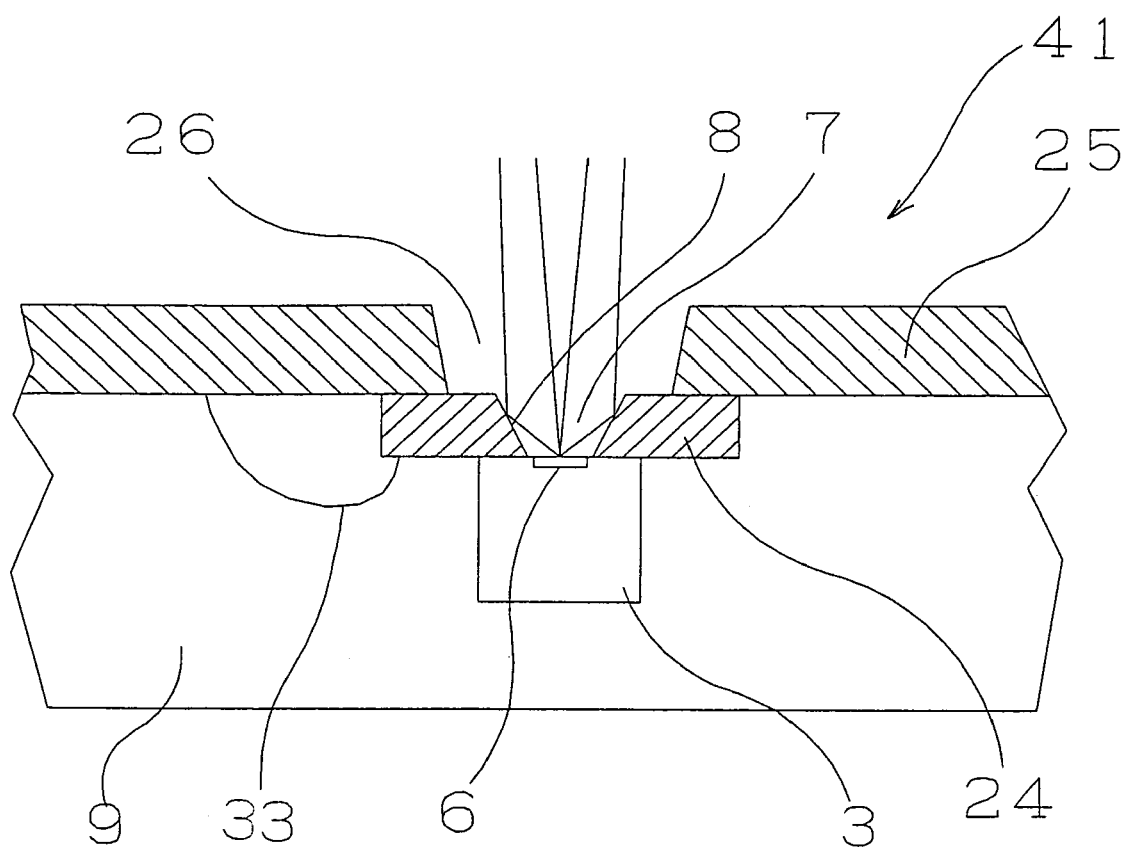
FIG. 16 is an enlarged view of an essential part of an optical transmitter according to Embodiment 4 of the present invention.

Still another modification of the above optical transmitter according to Embodiment 1 is given as an optical transmitter according to Embodiment 4 and explained referring to FIG. 16. FIG. 16 is an enlarged view of an essential part of an optical transmitter according to Embodiment 4 of the present invention.

As shown in FIG. 16, in the optical transmitter 41 according to Embodiment 4, the light-emitting element 3 is disposed on a submount 24 so that the submount 24 is interposed between the light-emitting element 3 and a second substrate 25.

The submount 24 has the through hole 7 and the taper mirror 8 similar to the ones formed through the lead frame 5 in Embodiment 1. The light-emitting element 3 is positioned so that the light-emitting surface 6 thereof faces the through hole 7, and is disposed on a rear surface of the submount 24.

The second substrate 25 has a light-emission hole (opening) 26 greater than the through hole of the submount 24. The through hole of the submount 24 communicates with the light-emission hole of the second substrate 25.

The submount 24 has the same effect as that of the lead frame 5 and can improve the optical transmission efficiency due to the function of the taper mirror 8.

This constitution allows the size of the member having the taper mirror 8, i.e., the size of the submount 24 to be kept slightly greater than the light-emitting element 3. Therefore, even if an expensive material is used for the submount 24, it does not significantly affect the cost.

That is, the material of the submount 24 can be selected without restraint and without considering the cost. Thus, by using, for example, a material having a high thermal conductivity or a material having high processability, it is possible to easily further improve the performance and the reliability of the optical transmitter 41.

The submount 24 is preferably obtained by processing a single-crystal silicon substrate through anisotropic etching.

A (111) plane having an angle of 54.74° is obtained as a smooth surface having a precise angle by, for example, etching a (100) plane of the single-crystal silicon with KOH (potassium hydroxide).

That is, the taper mirror 8 (see FIG. 4) obtained by processing the lead frame 5 is inferior to the taper mirror 8 obtained by processing the single-crystal silicon in processing accuracy, in plane accuracy, and in performance as a reflecting surface.

Accordingly, by using as the submount 24, a material that can provide high processing accuracy such as single-crystal silicon, it is possible to obtain the taper mirror 8 having high accuracy without incurring a rise in cost.

If the single-crystal silicon is used for the submount 24, the through hole 7 is shaped in quadrangular pyramid. SiC, AlN and the like in addition to Si can be used for the submount 24.

If the submount 24 is a non-conductive material, an electrode of a metal such as aluminum, not illustrated, is formed by deposition or the like on the rear surface of the submount 24. That electrode is bonded to the electrode (see the p-electrode 15 of FIG. 3) formed around the light-emitting surface 6 of the light-emitting element 3 so that electric conductive relationship is established between the electrodes. Alternatively, the submount 24 may be bonded to the second substrate 25 so that electric conductive relationship is established therebetween.

A difference between the submount 24 and the light-emitting element 3 in linear expansivity is preferably set smaller than a difference between the second substrate 25 and the light-emitting element 3 in linear expansivity. Generally, a significant difference between the lead frame 5 made of copper or the like and the light-emitting element 3 made of GaAs or the like in linear expansivity can cause high thermal stress due to a change in ambient temperature to make the light emission state of the light-emitting element 3 unstable. By selecting as the submount 24 a material less different from the light-emitting element 3 in linear expansivity, thermal stress can be reduced, thereby ensuring a stable performance in a wide temperature range. It is preferable to use, for example, Si (linear expansivity: about 3 ppm/K) as the submount 24 if copper (linear expansivity: about 18 ppm/K) is used as the second substrate 25 and GaAs (linear expansivity: 6 ppm/K) is used as the light-emitting element 3. As described above, the use of Si also facilitates the processing of the through hole 7.

Figure 17:
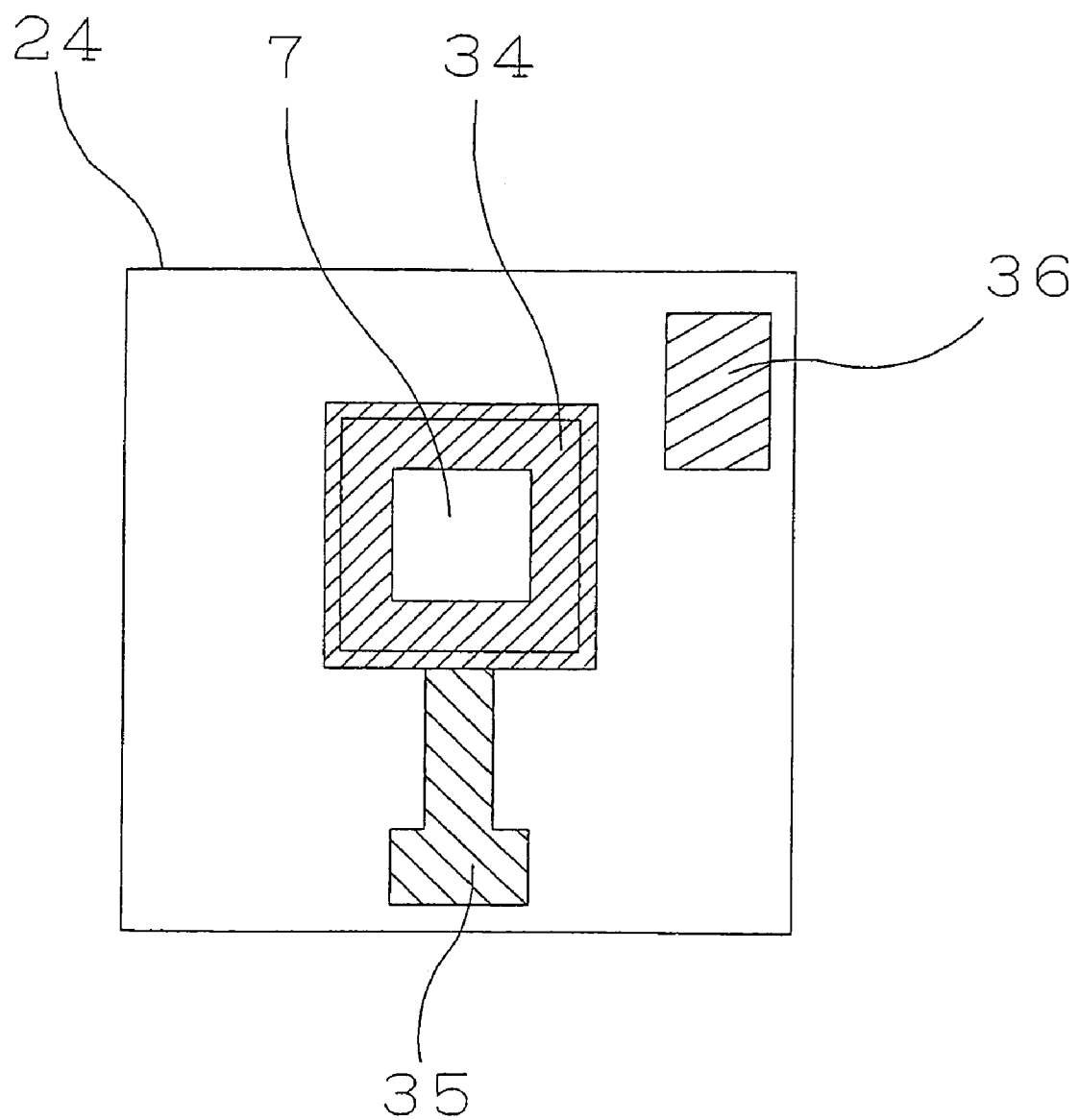
FIG. 17 is a view showing in detail a rear surface side of a submount of FIG. 16.

FIG. 17 shows an example of a rear surface side of the submount 24 (side on which the light-emitting element is disposed). A gold-tin film 34 is formed by patterning around the outer periphery of the through hole 7. The gold-tin film 34 contains 20 to 30 wt % of tin with respect to gold. The p-electrode 15 (see FIGS. 2 and 3) of the light-emitting element 3, on the other hand, is formed of a thin film of gold. By positioning the through hole 7 with respect to the light-emitting surface 6 of the light-emitting element 3, followed by heating while applying pressure, the gold-tin film 34 and the p-electrode 15 are forced to form a eutectic of gold and tin so that the light-emitting element 3 can be bonded to the submount 24. The light-emitting element 3 is indicated by the dash lines in FIG. 17. A first electrode 35 is electrically connected to the gold-tin film 34, and also connected to the second substrate 25 by the bonding wire 33. A second electrode 36, on the other hand, is connected by the bonding wire 33 to the n-electrode 11 of the light-emitting element 3 on its rear surface side, and also connected to the second substrate 25 by the bonding wire 33. Thus, the light-emitting element 3 is electrically connected via the submount 24 to the second substrate 25.

In Embodiment 4, as in the case of Embodiment 1, the mold resin (light-transmissive resin member) may be provided on the front surface side of the second substrate 25 so as to be filled in the light-emission hole 26 and in the through hole 7 and to have the lens formed as an integral part of the mold resin. Alternatively, as in the case of Embodiment 2, the adhesive may be filled in the light-emission hole 26 and in the through hole 7 to bond the lens so that the lens faces the light-emission hole 26.

Embodiment 5

Figure 18:
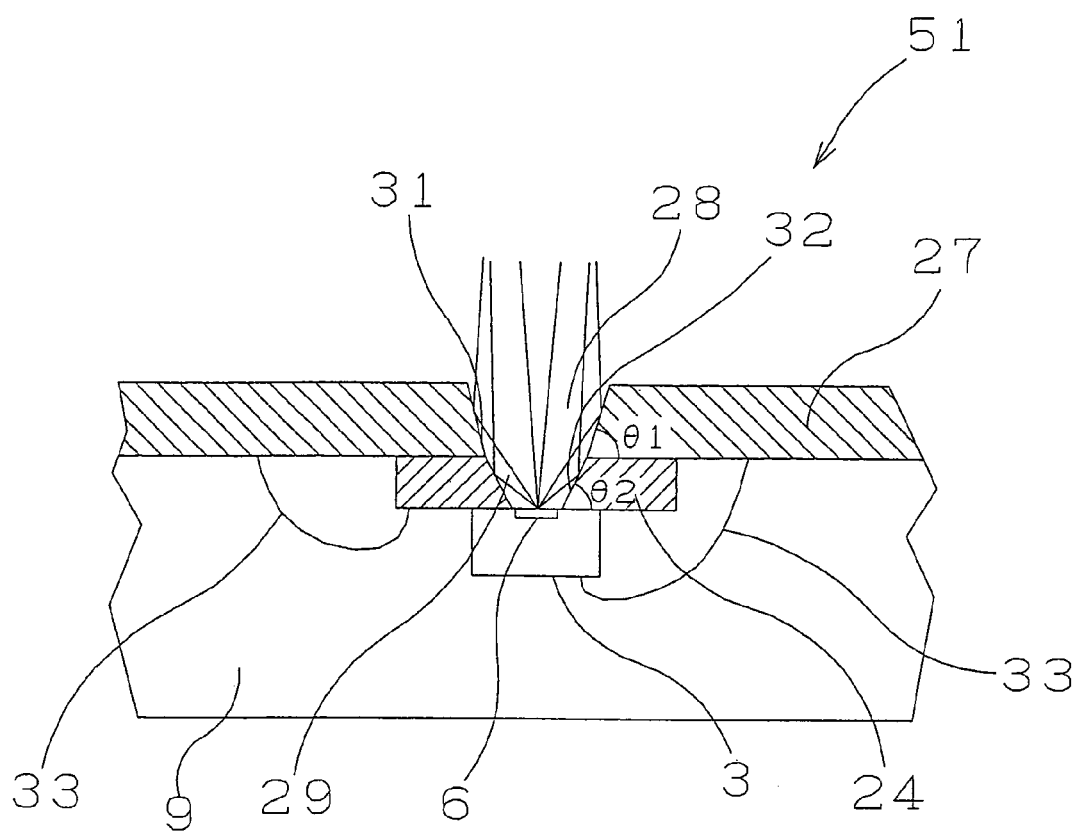
FIG. 18 is an explanatory view showing a schematic construction of an optical transmitter according to Embodiment 5 of the present invention.

A yet another modification of the above optical transmitter according to Embodiment 1 is given as an optical transmitter according to Embodiment 5 and explained referring to FIG. 18. FIG. 18 is an explanatory view showing a schematic structure of the optical transmitter according to Embodiment 5.

As shown in FIG. 18, in the optical transmitter 51 according to Embodiment 5, the light-emitting element 3 is disposed on the submount 24 so that the submount 24 is interposed between the light-emitting element 3 and a third substrate 27. The submount 24 has a second through hole 29 provided with a second mirror 32 as in the case of Embodiment 4. The third substrate 27 also has a first through hole 28 provided with a first mirror 31 as in the case of Embodiment 1. The light-emitting element 3 is positioned so that the light-emitting surface 6 faces the second through hole 29, and is disposed on the rear surface of the submount 24. The second through hole 29 of the submount 24 communicates with the first through hole 28 of the third substrate 27.

Since both the first mirror 31 and the second mirror 32 are used, the mirrors thickness is increased. As a result, the optical paths of light beams in an increased quantity can be changed, thereby increasing the optical transmission efficiency. The first mirror 31 and the second mirror 32 are preferably given different shapes in order to increase the optical transmission efficiency and to allow the mirrors shape to be arbitrary selected depending on the radiation state of light beams emitted from the light-emitting element 3.

Figure 22:
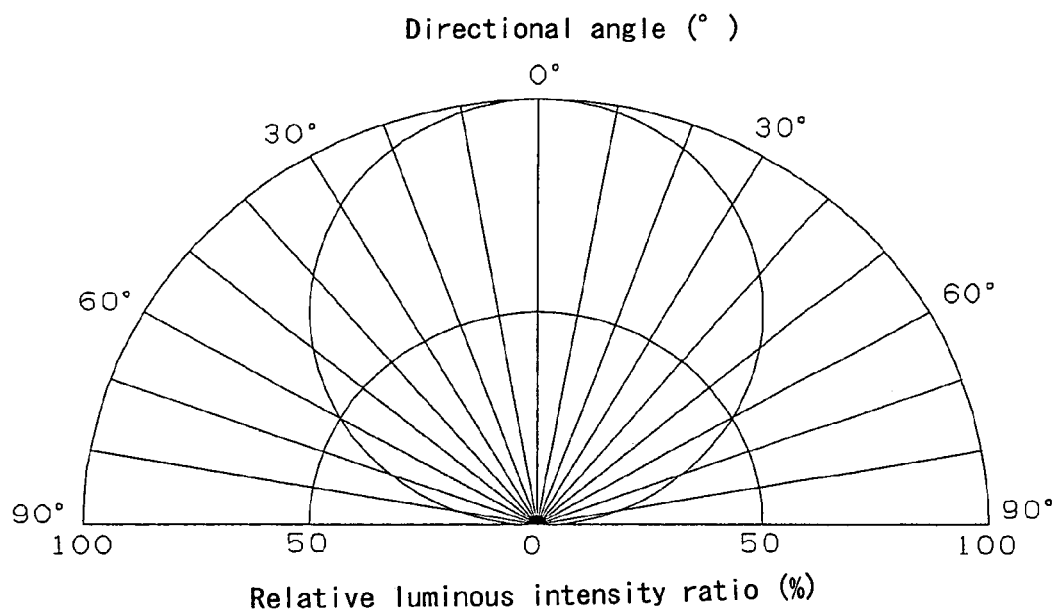
FIG. 22 is an explanatory view showing an example of a far field pattern of an LED.

Generally, a taper angle θ1 formed between the inner wall (first mirror 31) of the third substrate 27 and the light-emitting surface 6 of the light-emitting element 3 is preferably set greater than a taper angle θ2 formed between the inner wall (second mirror 32) of the submount 24 and the light-emitting surface 6 of the light-emitting element 3. This is because light beams from the light-emitting element 3 includes both a light beam having a wide radiation angle and a light beam having a narrow radiation angle, as shown in FIG. 22.

The second mirror 32, arranged closer to the light-emitting surface 6, receives a light beam having a wide radiation angle. Accordingly, the taper angle θ2 of the second mirror 32 is set smaller. The first mirror 31 receives a light beam with a narrow radiation angle. Accordingly, the taper angle θ1 of the first mirror 31 is set greater. Thus, it is ensured that the optical path of a light beam reflected from each mirror is changed substantially parallel to the optical axis of the light-emitting element 3, thereby improving the efficiency of coupling with the optical fiber.

Preferably the taper mirror of the first mirror 31 is set at 70° to 85° and the taper angle of the second mirror 32 is set at 40° to 70°. That is, since both the through hole of the third substrate 27 and the through hole of the submount 24 each have a mirror, the mirrors thickness is increased so that the optical paths of light beams in a broader range of radiation angles can be changed and the mirrors angle can be arbitrary selected depending on the radiation angles of light beams emitted from the light-emitting element 3, thereby achieving high utility efficiency.

Further, the use of the submount 24 produces the effect of reducing thermal stress created on the light-emitting element 3 as in the case of Embodiment 4. The submount 24 is preferably made of Si as in the case of Embodiment 4.

In Embodiment 5, as in the case of Embodiment 1, the mold resin (light-transmissive resin member) may be provided on the front surface side of the third substrate 27 so as to be filled in the first through hole 28 and in the second through hole 29 and to have the lens formed as an integral part of the mold resin. Alternatively, as in the case of Embodiment 2, the adhesive may be filled in the first through hole 28 and in the second through hole 29 to bond the lens so that the lens faces the first through hole 28.

As has been described above, the optical transmitters 1, 21, 31, 41 and 51 according to Embodiments 1 to 5 use either the through hole 7 formed in the lead frame 5 or in the submount 24, or the first through hole 28 and the second through hole 29 formed in the third substrate 27 and in the submount 24, respectively, in order to raise light beams radiated from light-emitting element 3. Thus, the optical transmission efficiency of these optical transmitters is increased and heat dissipation thereof is improved, while miniaturization and cost reduction of these optical transmitters can be achieved. The optical transmitters 1, 21, 31, 41 and 51 according to Embodiments 1 to 5 are merely examples of the present invention and various modifications may be made without departing from the spirit of the invention.

Embodiment 6

Figure 19:
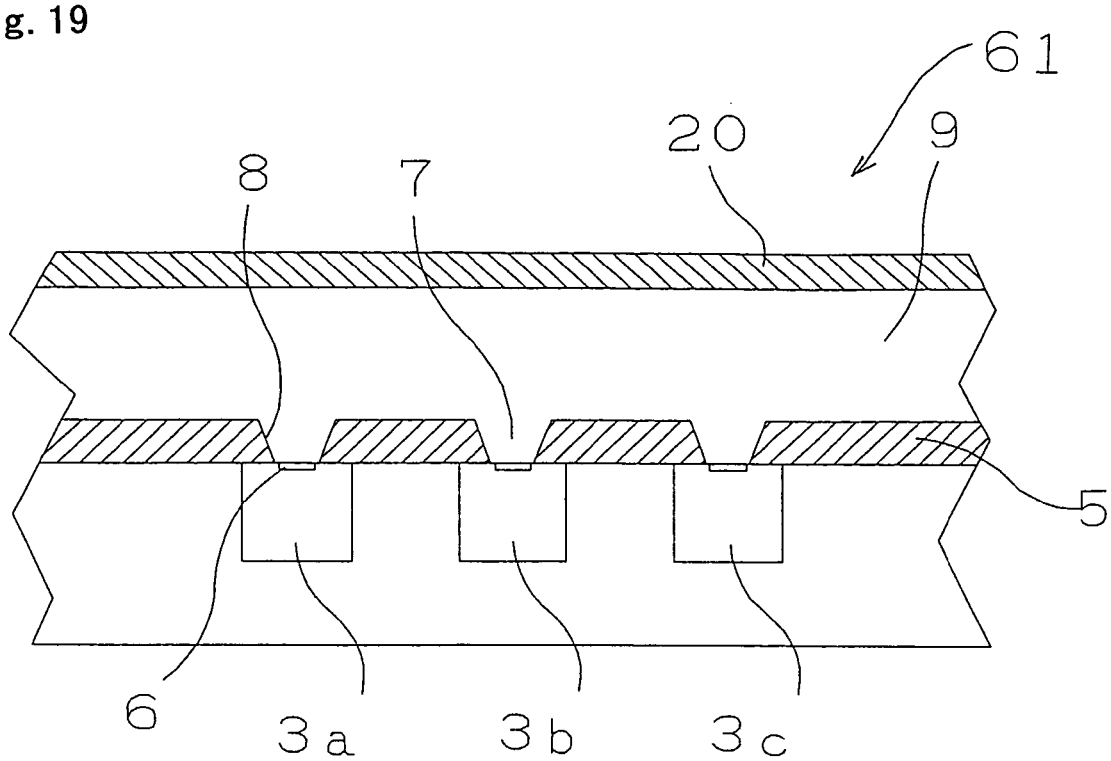
FIG. 19 is an explanatory view showing a schematic construction of an illumination device according to Embodiment 6 of the present invention.

An application of the above optical transmitter according to Embodiment 1 is given as an optical transmitter according to Embodiment 6 and explained referring to FIG. 19. FIG. 19 is an explanatory view showing a schematic structure of the illumination device according to Embodiment 6.

As shown in FIG. 19, the illumination device 61 according to Embodiment 6 of the present invention is the application of the above-described optical transmitter 1 according to Embodiment 1 (see FIG. 1).

In FIG. 19, light-emitting elements 3a, 3b and 3c respectively radiate light beams having different wavelengths such as light beams in three colors R, G and B (red, green and blue).

The optical path of a light beam radiated from each of the light-emitting elements 3a, 3b and 3c is changed by the taper mirror 8 as described in Embodiment 1.

These light beams passes through the mold resin 9 to be applied onto a light scattering film 20 where the light beams in those colors are scattered and mixed together to become, for example, white color light, which is then emitted to the outside.

As described in Embodiment 1, since the lead frame 5 having the taper mirror 8 is used, a light beam which usually cannot be used because of its wide radiation angle can be utilized effectively so that the light-utilization efficiency can be increased.

Further, since heat dissipation is improved as mentioned above, the amount of electric current to pass through the light-emitting element 3 can be increased. This makes it possible for the illumination device 61 to have high luminance, to be miniaturized, and to be manufactured at a low cost. Depending on its usage, the illumination device 61 may include a plurality sets of light-emitting elements 3a, 3b and 3c.

Embodiment 7

Figure 20:
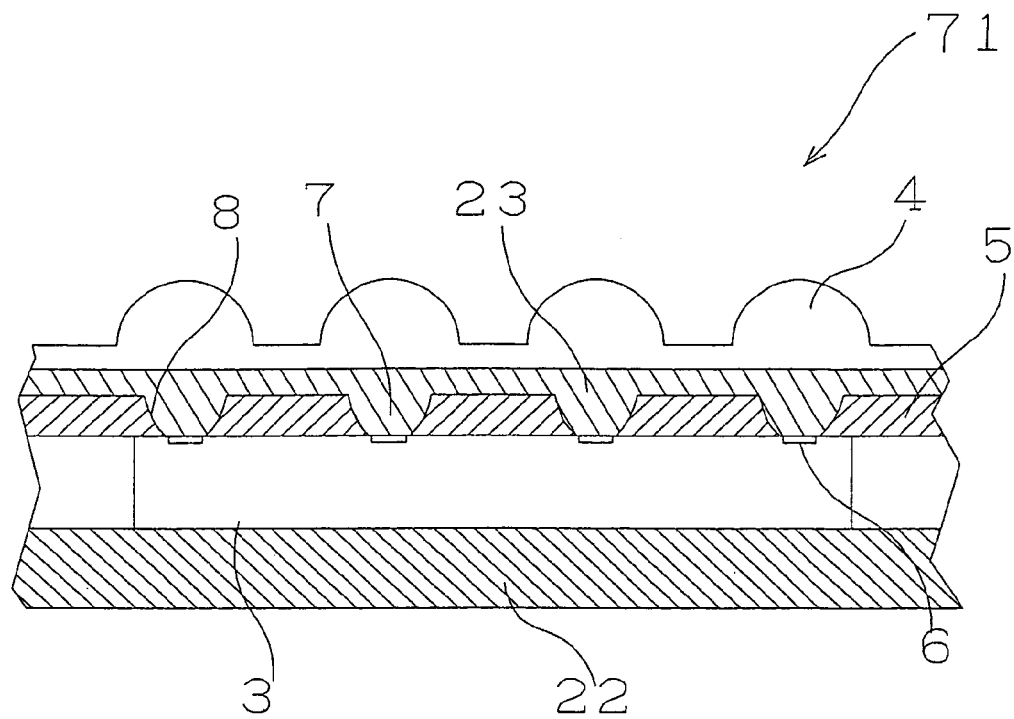
FIG. 20 is an explanatory view showing a schematic construction of an illumination device according to Embodiment 7 of the present invention.

A modification of the above illumination device to Embodiment 7 is given as an illumination device according to Embodiment 7 and explained referring to FIG. 20. FIG. 20 is an explanatory view showing a schematic structure of the illumination device according to Embodiment 7 referring to FIG. 20.

As shown in FIG. 20, in the illumination device 71 according to Embodiment 7, all the light-emitting elements 3 are adapted to radiate light beams having the same wavelength such as light beams in blue color.

Light beams radiated from the light-emitting elements 3 enter a phosphor 23 where part of the light beams is converted to light beams in yellow color or the like which are then mixed with the rest of the light beams in original color to become light beams in white color or the like.

Alternatively, light beams in white color may be obtained by a conventionally known method, for example, by using the light-emitting element 3 which emits ultraviolet light beam and causing the ultraviolet light beam to pass through phosphors 23 in R, G and B.

In Embodiment 7, the light-emitting element 3 is not an independent chip shown in FIG. 19 but has light-emitting surfaces 6 provided in array on the same wafer.

The light-emitting surfaces 6 are arranged not only in a width direction shown in the figure but also in a depth direction, not illustrated. The light-emitting element 3 is provided with several tens to several hundreds of light-emitting surfaces 6. This eliminates the need to dispose independent chips. Consequently, the illumination device can be manufactured at a low cost and miniaturized.

Also, in the light-emitting element 3, the electrodes (see the n-electrode 11 of FIG. 3) are provided opposite the light-emitting surfaces 6, respectively, and bonded to the rear-electrode substrate 22 with the electrically conductive adhesive such as a silver paste.

The lead frame 5 and the rear-electrode substrate 22 are electrically connected to an electric circuit, not illustrated, for the on/off control of the light-emitting element 3.

The rear-electrode substrate 22 is made of a metal having a high thermal conductivity such as aluminum, copper or phosphor bronze.

That is, the light-emitting element 3 is not electrically connected by an elongate member such as a wire. Instead, the electrode (see the p-electrode 15 of FIG. 3) of the light-emitting element 3 on the light-emitting surface 6 side and the electrode thereof on the rear surface side are in surface-to-surface contact with the lead frame 5 and the rear-electrode substrate 22, respectively. Accordingly, heat generated at the light-emitting element 3 can be dissipated efficiently, so that heat dissipation can be significantly improved.

As has been described above, the illumination devices 61 and 71 according to Embodiment 6 and Embodiment 7 use the through hole 7 formed in the lead frame 5 in order to raise light beams radiated from the light-emitting element 3. Thus, the optical transmission efficiency of these optical transmitters is increased and heat dissipation thereof is improved, while miniaturization and cost reduction of these optical transmitters can be achieved. The illumination devices 61 and 71 according to Embodiment 6 and Embodiment 7 are merely examples of the present invention and various modifications may be made without departing from the spirit of the invention.

The illumination devices 61 and 71 according to the present invention can be applied extensively in backlights for liquid crystal device, luminaires for illuminator, headlights for automobile, and flashlights for camera, as well as general purpose luminaires.

INDUSTRIAL APPLICABILITY

The present invention provides the industrial applicability below.

(1) The substrate has the through hole. The through hole has the inner wall. The through hole has the inside diameter increasing from the rear surface side of the substrate toward the front surface side thereof. Thus, of light beams radiated from the light-emitting portion, a light beam having a wide radiation angle can be reflected from the inner wall of the through hole toward the front surface of the substrate. Accordingly, a light beam having a wide radiation angle can be also effectively utilized for optical coupling with an optical fiber or the like, increasing the coupling efficiency.

(2) The light-emitting element is disposed on the rear surface of the substrate so that the light-emitting portion is exposed within the through hole. Thus, the light-emitting portion of the light-emitting element is close to the inner wall of the through hole. Accordingly, it is possible to reduce to a minimum the depth of the through hole involved in reflection of a light beam having a wide radiation angle toward the front surface of the substrate. Consequently, miniaturization of the optical transmitter can be achieved.

(3) The through hole formed in the substrate serves as a guide for light beams radiated from the light-emitting element. Thus, the substrate originally for use as a wiring component can also be utilized as an optical component. Accordingly, the number of components can be reduced and the production process can be simplified. Consequently, the optical transmitter can be manufactured at a low cost.

(4) The light-emitting element disposed so that the light-emitting portion is exposed within the through hole. Thus, the light-emitting portion as a heat-generating source is close to the substrate as a heat-dissipating medium. Accordingly, heat dissipation of the light-emitting element is improved.

(5) The light-emitting element and the bonding wire can be encapsulated in the mold resin containing the filler. Thus, thermal stress created on the light-emitting element and on the bonding wire can be reduced. Further, the light-emitting surface of the light-emitting element can be covered with the resin having resiliency. The light-emitting element can be disposed on the submount having a linear expansivity similar to that of the light-emitting element. Accordingly, thermal stress created on the light-emitting element can be reduced, so that the optical transmitter can be used and stored over a wide temperature range to gain a high reliability.

The invention claimed is:

1. An optical transmitter comprising:
a substrate having an opening;
a submount attached to the substrate and having a through hole; and
a light-emitting element disposed on a rear surface of the submount and having a light-emitting portion,
the through hole having an inner wall, the through hole having an inside diameter increasing from a rear surface side of the submount toward a front surface side thereof, the light-emitting element disposed so that the light-emitting portion is exposed within the through hole, the light emitting portion radiating light beams toward the opening of the substrate, the through hole being such that part of the light beams goes out the through hole and enters the opening of the substrate without being reflected, and that the other light beams goes out the through hole into the opening of the substrate after being reflected from the inner wall thereof, wherein a difference in linear expansivity between the submount and the light-emitting element is set smaller than a difference in linear expansivity between the substrate and the light-emitting element;

the submount is made of silicon, the silicon anisotropically etched to form the through hole;

the substrate is a lead frame for providing a connection to an outside electric circuit; and the light-emitting element includes an electrode provided around the light-emitting portion, the electrode electrically connected to the rear surface of the submount.

2. The optical transmitter of claim 1, wherein the through hole comprises a first inner-wall portion provided on the rear surface side of the submount and a second inner-wall portion provided on the front surface side of the submount, the first inner-wall portion having an inside diameter gradually increasing toward the front surface side of the submount, the second inner-wall portion having an inside diameter greater than a maximum inside diameter of the first inner-wall portion.

3. The optical transmitter of claim 1, wherein the inner wall of the through hole is concavely curved.

4. The optical transmitter of claim 1, wherein the submount has a thickness of 50 to 500 μm.

5. The optical transmitter of claim 1, further comprising an auxiliary substrate arranged so that the light-emitting element is sandwiched between the auxiliary substrate and the submount, the light-emitting element having a rear electrode on a rear surface thereof opposite the light-emitting portion, the rear electrode connected to the auxiliary substrate.

6. The optical transmitter of claim 1, further comprising an encapsulating resin-member provided on the rear surface side of the substrate for encapsulating the submount and the light-emitting element.

7. The optical transmitter of claim 6, wherein the encapsulating resin-member is made of resin, the resin containing a filler for lowering a linear expansivity of the encapsulating resin-member and for raising the thermal conductivity thereof.

8. The optical transmitter of claim 1, further comprising a transparent resin filled in the through hole and covering the light-emitting surface of the light-emitting element.

9. The optical transmitter of claim 8, further comprising a lens bonded by the transparent resin filled in the through hole and in the opening so that the lens faces the opening of the substrate.

10. The optical transmitter of claim 8, wherein the transparent resin has a hardness of 50 degrees or lower according to JIS-A.

11. The optical transmitter of claim 1, further comprising a light-transmissive resin member provided on the front surface side of the substrate so as to be filled in the through hole, the light-transmissive resin member having a lens formed as part thereof for collecting light beams radiated from the light-emitting element.

12. The optical transmitter of claim 11, wherein the substrate has a resin-injection groove formed in the front side surface thereof, the resin-injection groove communicating with the opening for facilitating the flow of light-transmissive resin into the opening and into the through hole communicating therewith at the formation of the light-transmissive resin member.

13. An optical transmitter comprising:
a substrate having a first through hole;
a submount attached to the substrate and having a second through hole; and
a light-emitting element disposed on a rear surface of the submount and having a light-emitting portion,
the first through hole having an inner wall, the first through hole having an inside diameter increasing from a rear surface side of the substrate toward a front surface side thereof, the second through hole having an inner wall, the second through hole having an inside diameter increasing from a rear surface side of the submount toward a front surface side thereof, the light-emitting element disposed so that the light emitting portion is exposed within the second through hole, the light-emitting portion radiating light beams toward a front surface side of the substrate, the first through hole and the second through hole being such that part of the light beams goes out the first through hole without being reflected, and the other light beams go out the first through hole after being reflected from at least one of the inner wall of the substrate and the inner wall of the submount, wherein a difference in linear expansivity between the submount and the light-emitting element is set smaller than a difference in linear expansivity between the substrate and the light-emitting element;

an angle formed between the inner wall of the first through hole and an optical axis of the light-emitting element is set smaller than an angle formed between the inner wall of the second through hole and the optical axis of the light-emitting element;

the submount is made of silicon, the silicon anisotropically etched to form the through hole;

the light-emitting element includes an electrode provided around the light-emitting portion, the electrode electrically connected to the rear surface of the submount; and the substrate is a lead frame for providing a connection to an outside electric circuit.

14. The optical transmitter of claim 13, wherein the first through hole comprises a first inner-wall portion provided on the rear surface side of the substrate and a second inner-wall portion provided on the front surface side of the substrate, the first inner-wall portion having and inside diameter gradually increasing toward the front surface side of the substrate, the second inner-wall portion having an inside diameter greater than a maximum inside diameter of the first inner-wall portion.

15. The optical transmitter according to claim 13, wherein the second through hole comprises a first inner-wall portion provided on the rear surface side of the submount and a second inner-wall portion provided on the front surface side of the submount, the first inner-wall portion having an inside diameter gradually increasing toward the front surface side of the submount, the second inner-wall portion having an inside diameter greater than a maximum inside diameter of the first inner-wall portion.

16. The optical transmitter of claim 13, wherein the inner wall of either the first through hole or the second through hole is concavely curved.

17. The optical transmitter of claim 13, wherein the substance and the submount each have a thickness of 50 to 500 μm.

18. The optical transmitter of claim 13, further comprising an auxiliary substrate arranged so that the light-emitting element is sandwiched between the auxiliary substrate and the submount, the light-emitting element having a rear electrode on a rear surface thereof opposite the light-emitting portion, the rear electrode connected to the auxiliary substrate.

19. The optical transmitter of claim 13, further comprising an encapsulating resin-member provided on the rear surface side of the substrate for encapsulating the submount and the light-emitting element.

20. The optical transmitter of claim 19, wherein the encapsulating resin-member is made of resin, the resin containing a filler for lowering a linear expansivity of the encapsulating resin-member and for raising the thermal conductivity thereof.

21. The optical transmitter of claim 13, further comprising a transparent resin filled in the through hole and covering the light-emitting surface of the light-emitting element.

22. The optical transmitter of claim 21, further comprising a lens bonded by the transparent resin filled in the first through hole and in the second through hole so that the lens faces the first through hole of the substrate.

23. The optical transmitter of claim 21, wherein the transparent resin has a hardness of 50 degrees or lower according to JIS-A.

24. The optical transmitter of claim 13, further comprising a light-transmissive resin member provided on the front surface side of the substrate so as to be filled in the first through hole and in the second through hole, the light-transmissive resin member having a lens formed as part thereof for collecting light beams radiated from the light-emitting element.

25. The optical transmitter of claim 24, wherein the substrate has a resin-injection groove formed in the front side surface thereof, the resin-injection groove communicating with the first through hole for facilitating the flow of light-transmissive resin into the first through hole and into the second through hole communicating therewith at the formation of the light-transmissive resin member.

* * * * *